(12) United States Patent
Machida

(10) Patent No.: US 11,060,797 B2
(45) Date of Patent: Jul. 13, 2021

(54) LOOP HEAT PIPE

(71) Applicant: SHINKO ELECTRIC INDUSTRIES CO., LTD., Nagano (JP)

(72) Inventor: Yoshihiro Machida, Nagano (JP)

(73) Assignee: Shinko Electric Industries, Co., Ltd.

( * ) Notice: Subject to any disclaimer, the term of this patent is extended or adjusted under 35 U.S.C. 154(b) by 47 days.

(21) Appl. No.: 16/351,724

(22) Filed: Mar. 13, 2019

(65) Prior Publication Data

US 2019/0285354 A1 Sep. 19, 2019

(30) Foreign Application Priority Data

Mar. 16, 2018 (JP) .............................. JP2018-049326

(51) Int. Cl.
*F28D 15/02* (2006.01)
*F28F 19/00* (2006.01)

(52) U.S. Cl.
CPC .......... *F28D 15/0266* (2013.01); *F28F 19/00* (2013.01); *F28F 2225/04* (2013.01)

(58) Field of Classification Search
CPC .... F28D 15/0266; F28F 2225/04; F28F 19/00
See application file for complete search history.

(56) References Cited

U.S. PATENT DOCUMENTS

| | | | | |
|---|---|---|---|---|
| 6,843,308 B1 * | 1/2005 | Duval | ................. | F28D 15/0233 165/104.26 |
| 10,215,497 B2 * | 2/2019 | Noishiki | ................. | F28F 3/086 |
| 10,739,085 B2 * | 8/2020 | Bungo | ................ | H05K 7/20254 |
| 2010/0044014 A1 * | 2/2010 | Ho | .......................... | F28D 1/035 165/104.26 |
| 2011/0268616 A1 * | 11/2011 | Noishiki | .............. | B01J 19/0093 422/129 |
| 2012/0106084 A1 * | 5/2012 | Mizuta | .................. | F28D 15/046 361/700 |
| 2012/0208265 A1 * | 8/2012 | Partsch | .................... | F28F 3/086 435/289.1 |
| 2016/0259383 A1 | 9/2016 | Shioga et al. | | |

FOREIGN PATENT DOCUMENTS

JP 6146484 B2 6/2017

\* cited by examiner

*Primary Examiner* — Gordon A Jones
(74) *Attorney, Agent, or Firm* — Tarolli, Sundheim, Covell & Tummino LLP

(57) ABSTRACT

A loop heat pipe includes a metal layer stack of outermost metal layers and intermediate metal layers. The metal layer stack includes an evaporator that vaporizes a working fluid, a condenser that liquefies the working fluid vaporized by the evaporator, a vapor pipe connecting the evaporator to the condenser, and a liquid pipe connecting the condenser to the evaporator. The vapor pipe includes two pipe walls defining a flow passage of the vapor pipe and joint beams arranged at different positions along the flow passage. Each of the joint beams joins the two pipe walls to each other. Each of the intermediate metal layers includes one of the joint beams. Each of the joint beams includes a side surface that is inclined.

10 Claims, 15 Drawing Sheets

LOOP HEAT PIPE

CROSS-REFERENCE TO RELATED APPLICATIONS

This application is based upon and claims the benefit of priority from prior Japanese Patent Application No. 2018-049326, filed on Mar. 16, 2018, the entire contents of which are incorporated herein by reference.

FIELD

This disclosure relates to a loop heat pipe.

BACKGROUND

A heat pipe is a typical device that transfers heat using phase transition of a working fluid to cool heat-generating components of a semiconductor device (e.g., CPU) mounted on an electronic device (refer to Japanese Patent No. 6146484). Japanese Patent No. 6146484 discloses a structure of a heat pipe including a vapor pipe in which the vapor pipe includes a support post joined to an inner wall of the vapor pipe with a bridge.

SUMMARY

When a vapor pipe includes a bridge and a support post as in the heat pipe described above, the flow rate of vapor in the vapor pipe may decrease. This decreases the heat transfer efficiency. Thus, there is a demand for improvement of the flow rate of vapor to increase the heat transfer efficiency.

One embodiment of a loop heat pipe includes a metal layer stack of two outermost metal layers and intermediate metal layers stacked between the two outermost metal layers. The metal layer stack includes an evaporator that vaporizes a working fluid, a condenser that liquefies the working fluid vaporized by the evaporator, a vapor pipe connecting the evaporator to the condenser, and a liquid pipe connecting the condenser to the evaporator. The vapor pipe includes two pipe walls defining a flow passage of the vapor pipe and joint beams arranged at different positions along the flow passage. Each of the joint beams joins the two pipe walls to each other. Each of the intermediate metal layers includes one of the joint beams. Each of the joint beams includes a side surface that is inclined.

Another embodiment of a loop heat pipe includes a metal layer stack of two outermost metal layers and intermediate metal layers stacked between the two outermost metal layers. The metal layer stack includes an evaporator that vaporizes a working fluid, a condenser that liquefies the working fluid vaporized by the evaporator, a vapor pipe connecting the evaporator to the condenser, and a liquid pipe connecting the condenser to the evaporator. The vapor pipe includes two pipe walls defining a flow passage of the vapor pipe and joint beams arranged at different positions along the flow passage. Each of the joint beams joins the two pipe walls to each other. Each of the intermediate metal layers includes two walls forming the two pipe walls of the vapor pipe and one of the joint beams. Each of the joint beams is at least partially thinner than the walls of a corresponding one of the intermediate metal layers.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Various embodiments will be described below. Elements in the accompanying drawings may be enlarged for simplicity and clarity and thus have not necessarily been drawn to scale. To facilitate understanding, hatching lines (shadings) drawn in the plan views may not be illustrated in the cross-sectional views. In this specification, the "plan view" refers to a cross-sectional view of an object taken in the vertical direction (for example, vertical direction in FIG. 3), and the "planar shape" refers to a shape of an object in the plan view.

First Embodiment

Figure 1:
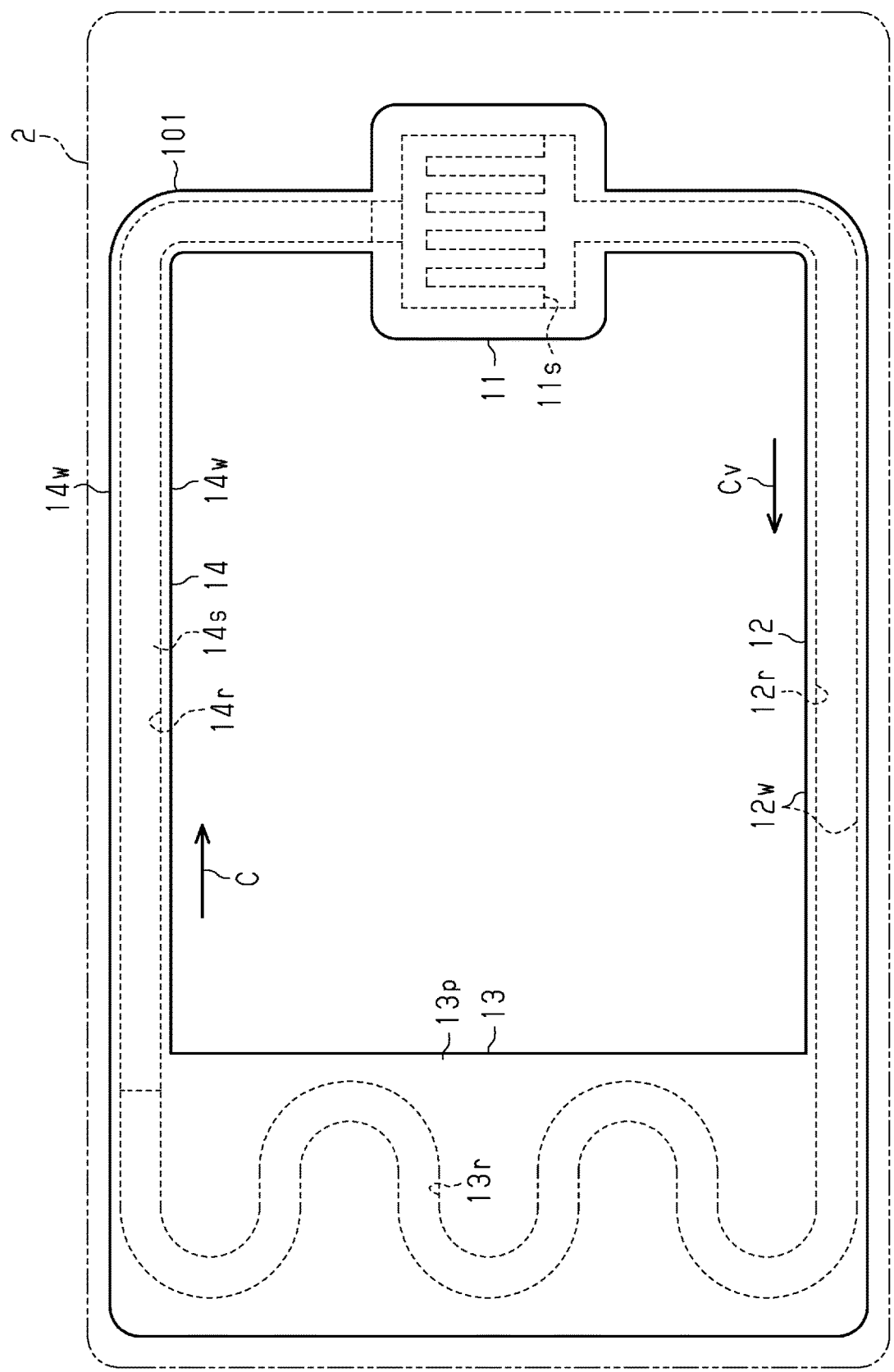
FIG. 1 is a schematic plan view illustrating a first embodiment of a loop heat pipe.

A first embodiment will now be described. As illustrated in FIG. 1, a loop heat pipe 101 is, for example, accommodated in a mobile electronic device 2 such as a smartphone or a tablet terminal.

The loop heat pipe 101 includes an evaporator 11, a vapor pipe 12, a condenser 13, and a liquid pipe 14.

The evaporator 11 has a function to vaporize a working fluid C and generate a vapor Cv. The condenser 13 has a function to liquefy the vaporized working fluid C (or vapor Cv). The vapor pipe 12 connects the evaporator 11 to the condenser 13 to transfer the vapor Cv to the condenser 13. The liquid pipe 14 connects the evaporator 11 to the condenser 13 to transfer the liquefied working fluid C to the evaporator 11. The vapor pipe 12 and the liquid pipe 14 together with the evaporator 11 and the condenser 13 form a loop flow passage through which the working fluid C or the vapor Cv flows.

In the present example, the liquid pipe 14 and the vapor pipe 12, for example, have the same length. However, the liquid pipe 14 and the vapor pipe 12 may have different lengths. For example, the vapor pipe 12 may be shorter than the liquid pipe 14.

The evaporator 11 is in close contact with and fixed to a heat-generating component (not illustrated). The evaporator 11 includes a wick 11s. The wick 11s is a capillary structural body that produces capillary force on the working fluid C. Heat generated in the heat-generating component vaporizes the working fluid C in the evaporator 11 to generate the vapor Cv. Thermal interface material (TIM) may be arranged between the evaporator 11 and the heat-generating component. The thermal interface material reduces a thermal contact resistance between the heat-generating component and the evaporator 11 and smoothly transfers heat from the heat-generating component to the evaporator 11.

The vapor pipe 12 includes two pipe walls 12w located at opposite sides in the width-wise direction (vertical direction in FIG. 1) and a flow passage 12r located between the pipe walls 12w. The flow passage 12r is in communication with an inner void of the evaporator 11. The flow passage 12r is a portion of the loop flow passage described above. The vapor Cv generated in the evaporator 11 flows through the flow passage 12r of the vapor pipe 12 and is guided to the condenser 13.

The condenser 13 includes a heat dissipation plate 13p having a large area for heat dissipation and a flow passage 13r meandering through the heat dissipation plate 13p. The flow passage 13r is in communication with the flow passage 12r of the vapor pipe 12. The flow passage 13r is a portion of the loop flow passage described above. The condenser 13 liquefies the vapor Cv, which is guided via the vapor pipe 12 to the flow passage 13r.

The liquid pipe 14 includes two pipe walls 14w located at opposite sides in the width-wise direction (vertical direction in FIG. 1), a flow passage 14r between the pipe walls 14w, and a wick 14s arranged in the flow passage 14r. The flow passage 14r is in communication with the flow passage 13r of the condenser 13 and the inner void of the evaporator 11. The flow passage 14r is a portion of the loop flow passage described above. The wick 14s extends from the condenser 13 to the evaporator 11 along the liquid pipe 14. The wick 14s is a capillary structural body that produces capillary force on the working fluid C. The wick 14s uses the capillary force generated in the wick 14s to guide the working fluid C liquefied by the condenser 13 to the evaporator 11.

Preferably, fluid having a high vapor pressure and a high latent heat of vaporization is used as the working fluid C. The use of such a working fluid C efficiently cools the heat-generating component with the latent heat of vaporization. Examples of the working fluid C include ammonia, water, chlorofluorocarbon, alcohol, and acetone.

The loop heat pipe 101 may be, for example, formed by a metal layer stack including multiple metal layers. In a non-restrictive example, the loop heat pipe 101 is formed by a metal layer stack including six metal layers 31 to 36 (for example, refer to FIGS. 3 to 5) so that the metal layer stack includes the evaporator 11, the vapor pipe 12, the condenser 13, and the liquid pipe 14. The metal layers 31 to 36 are, for example, copper layers having superior thermal conductance and directly bonded with each other through solid-phase bonding or the like. The metal layers 31 to 36 may each have a thickness of, for example, approximately 50 μm to 200 μm. The metal layers 31 to 36 are not limited to copper layers and may be stainless layers, aluminum layers, magnesium alloy layers, or the like. Additionally, the number of stacked metal layers is not particularly limited. One or more of the metal layers 31 to 36 may be formed from a material differing from the material of the other metal layers.

The structure of the metal layer stack (metal layers 31 to 36) of the loop heat pipe 101 will now be described using the vapor pipe 12 as an example.

Figure 3:
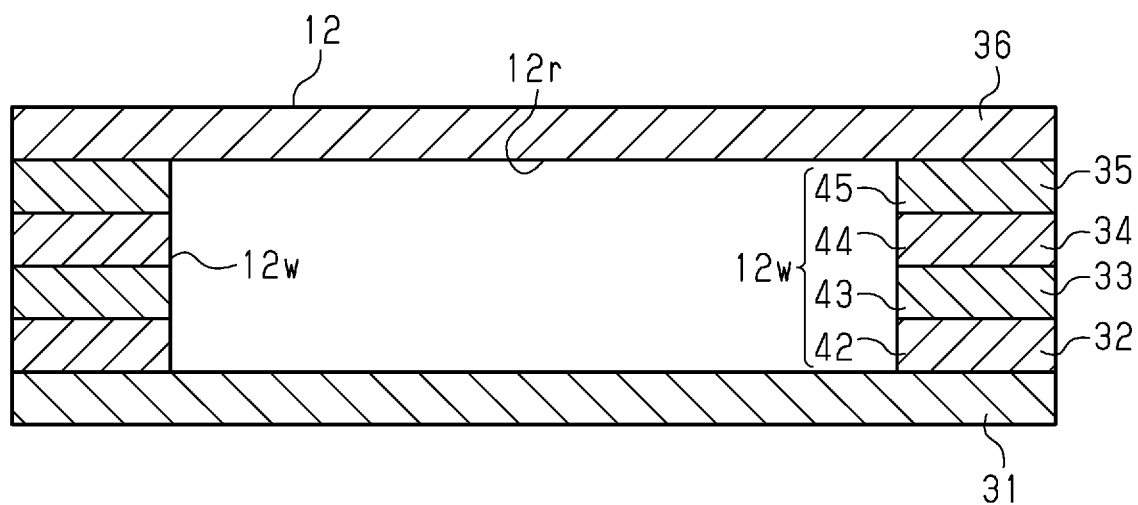
FIG. 3 is a schematic cross-sectional view of the vapor pipe illustrated in FIG. 2.

As illustrated in FIG. 3, the vapor pipe 12 has a structure in which, for example, the metal layers 31 to 36 are sequentially stacked. Hereafter, the metal layer 31 may be referred to as the outermost metal layer 31 (or lowermost metal layer 31), the metal layer 36 may be referred to as the outermost metal layer 36 (or uppermost metal layer 36), and the metal layers 32 to 35 may be referred to as the intermediate metal layers 32 to 35. When there is no need to distinguish the outermost metal layers from the intermediate metal layers, the metal layers will simply be referred to as the metal layers 31 to 36. In FIG. 3 (and other drawings), to facilitate understanding, the metal layers 31 to 36 are distinguished from each other by solid lines and indicated by different hatching lines. However, when integrating the metal layers 31 to 36 through, for example, diffusion bonding, the interfaces of the metal layers 31 to 36 will be eliminated, and the boundaries of the metal layers 31 to 36 may not be clear.

The outermost metal layers 31 and 36 are arranged at outermost sides of the metal layer stack of the metal layers 31 to 36. The intermediate metal layers 32 to 35 are arranged between the outermost metal layer 31 and the outermost metal layer 36. Thus, the loop heat pipe 101 including the vapor pipe 12 includes the two outermost metal layers 31 and 36 and the intermediate metal layers 32 to 35 stacked between the two outermost metal layers 31 and 36. The outermost metal layers 31 and 36 are solid and free from holes and pits. The intermediate metal layers 32 to 35 respectively include walls 42, 43, 44, and 45 forming the pipe walls 12w of the vapor pipe 12.

Although not illustrated in the drawings, the evaporator 11, the condenser 13, and the liquid pipe 14, which are illustrated in FIG. 1, are also formed by the metal layers 31 to 36 stacked as described above.

Figure 2:
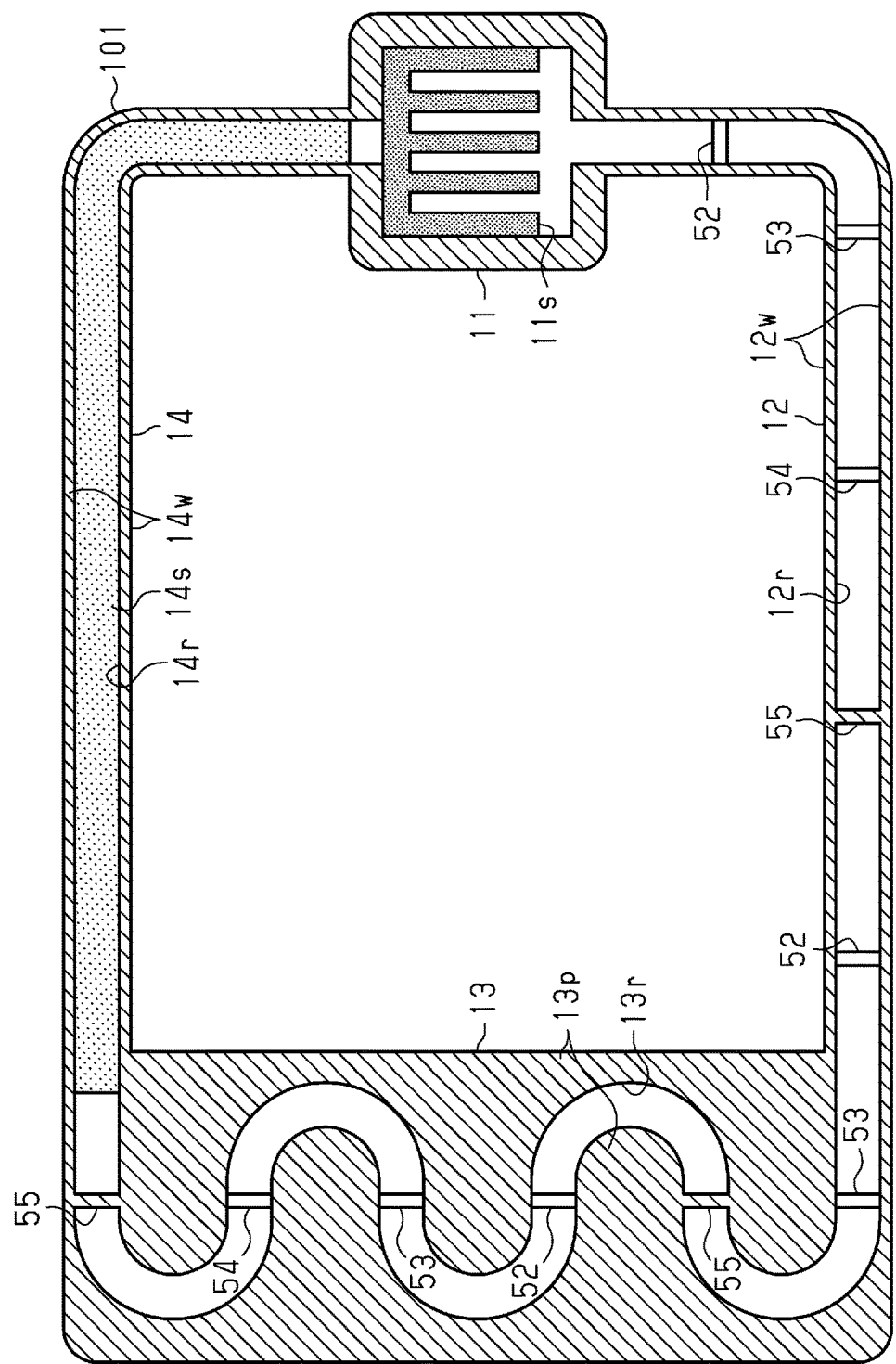
FIG. 2 is a schematic plan view of the loop heat pipe illustrated in FIG. 1 from which the uppermost metal layer is removed.

FIG. 2 illustrates the loop heat pipe 101 from which the uppermost metal layer 36 is removed.

The vapor pipe 12 includes joint beams 52, 53, 54, and 55 arranged in the flow passage 12r. In the same manner, the condenser 13 includes joint beams 52 to 55 arranged in the flow passage 13r.

In the vapor pipe 12, each of the joint beams 52 to 55 joins the two pipe walls 12w, which are located at opposite sides of the flow passage 12r. In the same manner, in the condenser 13, each of the joint beams 52 to 55 joins two pipe walls (inner walls of the heat dissipation plate 13p) located at opposite sides of the flow passage 13r.

In each of the vapor pipe 12 and the condenser 13, the joint beams 52 to 55 are arranged in positions that do not overlap with each other in a plan view (i.e., thickness-wise direction of the metal layers 31 to 36). Thus, the flow passage 12r of the vapor pipe 12 and the flow passage 13r of the condenser 13 are not closed.

The joint beams 52 to 55 of the vapor pipe 12 will now be described. In the following description, the flow passage 12r and the configuration related to the flow passage 12r may be replaced with the flow passage 13r and the configuration related to the flow passage 13r so that the joint beams 52 to 55 of the condenser 13 substantially have the same configuration as the joint beams 52 to 55 of the vapor pipe 12. The joint beam 55 will now be described.

Figure 4:
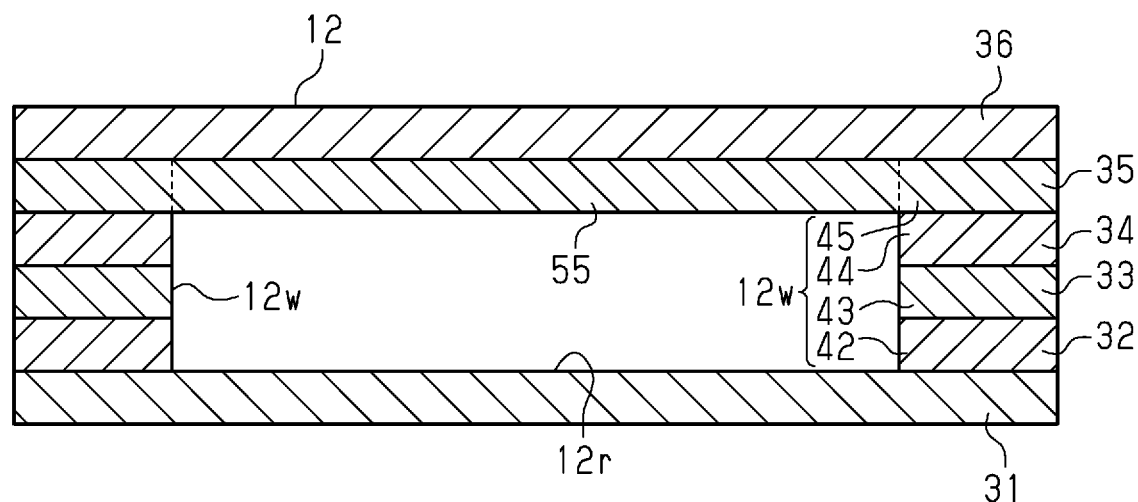
FIG. 4 is a schematic cross-sectional view of a portion of the vapor pipe illustrated in FIG. 2 including a joint beam.

As illustrated in FIG. 4, the intermediate metal layer 35 includes the joint beam 55. At the position of the joint beam 55, the flow passage 12r includes a flow passage space surrounded by the two pipe walls 12w of the vapor pipe 12, the outermost metal layer 31, and the joint beam 55.

Figure 5:
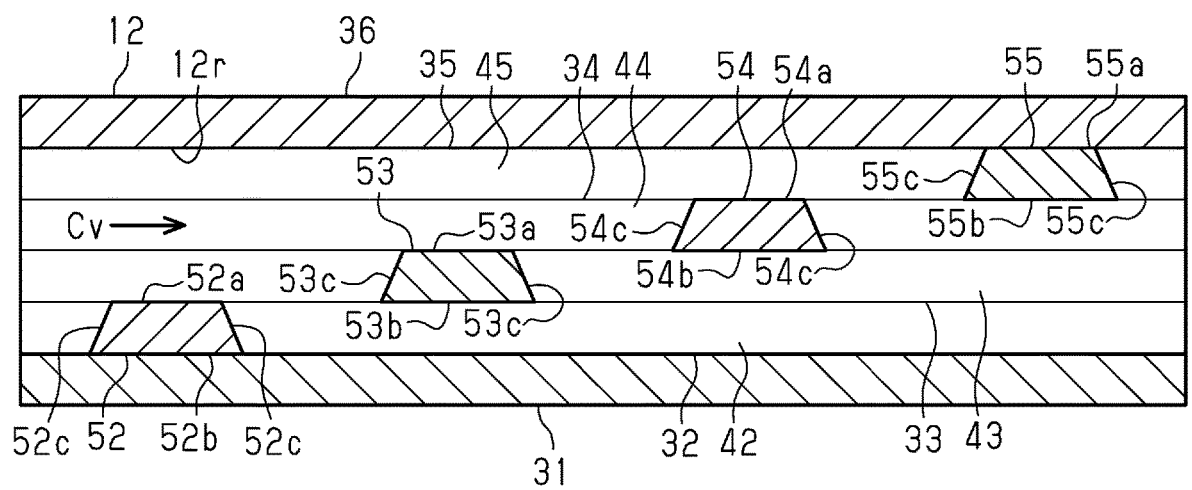
FIG. 5 is a schematic cross-sectional view of the vapor pipe illustrated in FIG. 2 taken in a direction along a flow passage.

As illustrated in FIG. 5, the joint beam 55 includes an upper surface 55a, a lower surface 55b, and two side surfaces 55c. In the joint beam 55, the upper surface 55a has a smaller width (dimension in sideward direction in FIG. 5) than the lower surface 55b. In other words, the upper surface 55a has a smaller area than the lower surface 55b. Each of the side surfaces 55c includes an inclined surface inclined inward from the lower surface 55b toward the upper surface 55a. Thus, while the almost entire portion (central portion) of the joint beam 55 has the same thickness as the walls 45 of the intermediate metal layer 35, portions of the joint beam 55 at the side surfaces 55c (inclined surfaces) are thinner than the walls 45.

The joint beams 52 to 54 are formed in the same manner as the joint beam 55. In the present example, as illustrated in FIG. 5, the joint beams 52 to 54 are respectively formed by the metal layers 32 to 34 and include upper surfaces 52a to 54a, lower surfaces 52b to 54b, and side surfaces 52c to 54c. In the joint beams 52 to 54, the side surfaces 52c to 54c include inclined surfaces that are inclined inward from the lower surfaces 52b to 54b toward the upper surfaces 52a to 54a. Thus, while the almost entire portion (central portion) of each of the joint beams 52 to 54 has the same thickness as the walls 42 to 44 of the intermediate metal layers 32 to 34, portions of each of the joint beams 52 to 54 at the side surfaces 52c to 54c (inclined surfaces) are thinner than the walls 42 to 44.

In the vapor pipe 12, as indicated by the arrow in FIG. 5, the vapor Cv (vaporized working fluid C) flows from the left side to the right side along the flow passage 12r. Thus, the side surfaces 52c to 55c of the joint beams 52 to 55 are inclined from the direction in which the vapor Cv flows in the flow passage 12r.

At the position of the joint beam 52, the flow passage 12r includes a flow passage space surrounded by the two pipe walls 12w (refer to FIG. 4), the joint beam 52, and the outermost metal layer 36. At the position of the joint beam 53, the flow passage 12r includes a flow passage space surrounded by the two pipe walls 12w, the joint beam 53, and the outermost metal layer 31 and a flow passage space surrounded by the two pipe walls 12w, the joint beam 53, and the outermost metal layer 36. At the position of the joint beam 54, the flow passage 12r includes a flow passage space surrounded by the two pipe walls 12w, the joint beam 54, and the outermost metal layer 31 and a flow passage space surrounded by the two pipe walls 12w, the joint beam 54, and the outermost metal layer 36.

Each of the metal layers 31 to 36 is formed by, for example, patterning a copper layer having a thickness of 100 μm into a given shape by performing wet etching. Wet etching is performed with, for example, a spray etching machine. The etchant of wet etching may be, for example, a ferric chloride solution, a copper(II) chloride solution, or an ammonium persulfate solution. Wet etching may be performed with other etching machines such as a dipping etching machine and a spinner etching machine.

The etching of the copper layers forms the metal layers 31 to 36 and frames (not illustrated) that support the metal layers 31 to 36. The metal layers 31 to 36 are joined to the frames with bridges (joint members), which are not illustrated in the drawings.

For example, at the position of the vapor pipe 12 (refer to FIG. 4), the two walls 45 of the intermediate metal layer 35 are jointed to the frame by the above-described bridge (joint member). The two walls 45 are also joined to each other by the joint beam 52. The intermediate metal layers 32 to 34 are formed in the same manner as the intermediate metal layer 35.

Then, the intermediate metal layers 32 to 35 are placed between the outermost metal layers 31 and 36. While the metal layers 31 to 36 are heated to a given temperature (for example, approximately 900° C.), the stacked metal layers 31 to 36 are pressed so that diffusion bonding is performed on the metal layers 31 to 36.

Subsequently, the air is discharged, for example, from the liquid pipe 14 using a vacuum pump (not illustrated). The working fluid C (e.g., water) is injected into the liquid pipe 14 through an inlet (not illustrated). When the inlet is closed, the loop heat pipe 101 is completed.

The first embodiment has the advantages described below.

(1-1) The loop heat pipe 101 includes the metal layer stack of the outermost metal layers 31 and 36 and the intermediate metal layers 32 to 35 stacked between the outermost metal layers 31 and 36. The metal layer stack includes the evaporator 11 vaporizing the working fluid C, the condenser 13 liquefying the vaporized working fluid C (vapor Cv), the vapor pipe 12 connecting the evaporator 11 to the condenser 13, and the liquid pipe 14 connecting the condenser 13 to the evaporator 11. The vapor pipe 12 includes the two pipe walls 12w defining the flow passage 12r and the joint beams 52 to 55 arranged at different positions along the flow passage 12r. Each of the joint beams 52 to 55 joins the two pipe walls 12w. Each of the intermediate metal layers 32 to 35 includes one of the joint beams 52 to 55. The side surfaces 52c to 55c of the joint beams 52 to 55 are inclined from the direction in which the vapor Cv flows in the flow passage 12r. With this configuration, although the vapor pipe 12 includes the joint beams 52 to 54, the vapor Cv readily flows along the side surfaces 52c to 54c. This improves the flow rate of the vapor Cv in the vapor pipe 12 and increases the heat transfer efficiency.

(1-2) The flow passage 13r of the condenser 13 also includes the joint beams 52 to 55. Thus, in the same manner as the vapor pipe 12, the vapor Cv readily flows in the condenser 13.

Modified Examples of First Embodiment

The first embodiment may be modified as follows. The modified examples described below relate to joint beams of the vapor pipe 12. Thus, the drawings illustrate components related to the joint beams and do not illustrate other components. The same reference characters are given to those components that are the same as the corresponding components of the first embodiment. Such components will partially or entirely not be described. The following modified examples are applicable to the joint beams of the condenser 13.

Figure 6:
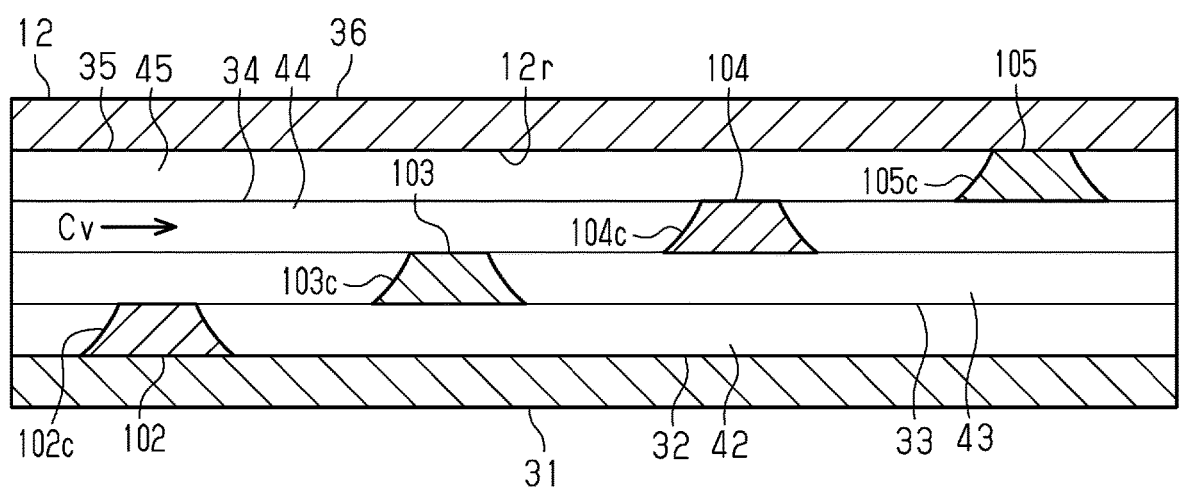
FIGS. 6 to 12 are schematic cross-sectional views of various modified examples of vapor pipes taken in a direction along a flow passage.

As illustrated in FIG. 6, the intermediate metal layer 32 includes the two walls 42 (refer to FIG. 4) and a joint beam 102 joining the walls 42 to each other. Also, in the same manner as the intermediate metal layer 32, the intermediate metal layers 33 to 35 respectively include the walls 43 to 45 and joint beams 103 to 105. The joint beams 102 to 105 respectively include concave-curved side surfaces 102c, 103c, 104c, and 105c. Such concave-curved side surfaces 102c to 105c also improve the flow rate of the vapor Cv and increase the heat transfer efficiency.

Figure 7:
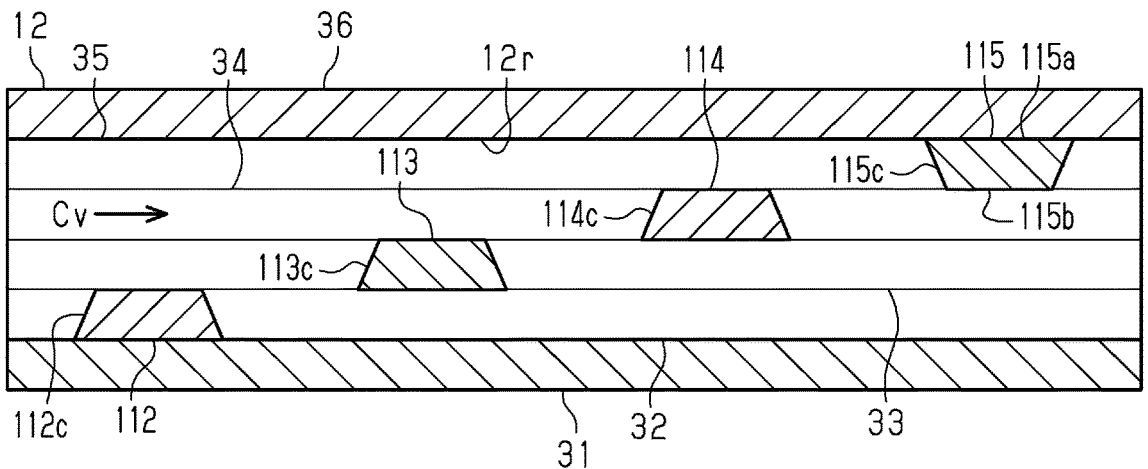

As illustrated in FIG. 7, the intermediate metal layers 32 to 35 respectively include joint beams 112 to 115. In the same manner as the joint beams 52 to 54 (refer to FIG. 5) of the first embodiment, the joint beams 112 to 114 respectively include side surfaces 112c, 113c, and 114c that are inclined inward from the lower surface (lower side in FIG. 7) toward the upper surface. The joint beam 115 includes an upper surface 115a, a lower surface 115b having a smaller area than the upper surface 115a, and a side surface 115c including an inclined surface inclined inward from the upper surface 115a toward the lower surface 115b. The intermediate metal layer 35 is located adjacent to (in contact with) the outermost metal layer 36 (uppermost metal layer). The inward inclination of the side surface 115c from the upper surface 115a toward the lower surface 115b forms an obtuse angle between the side surface 115c of the joint beam 115 and the lower surface of the outermost metal layer 36, which defines the upper surface of the flow passage 12r for the vapor Cv. Thus, the vapor Cv flowing along the lower surface of the outermost metal layer 36 is guided downward, for example, as compared to a case in which an acute angle is formed between the lower surface of the outermost metal layer 36 and the side surfaces 55c and 105c of the joint beams 55 and 105 as illustrated in FIGS. 5 and 6. This further improves the flowability of the vapor Cv and increases the heat transfer efficiency.

Figure 8:
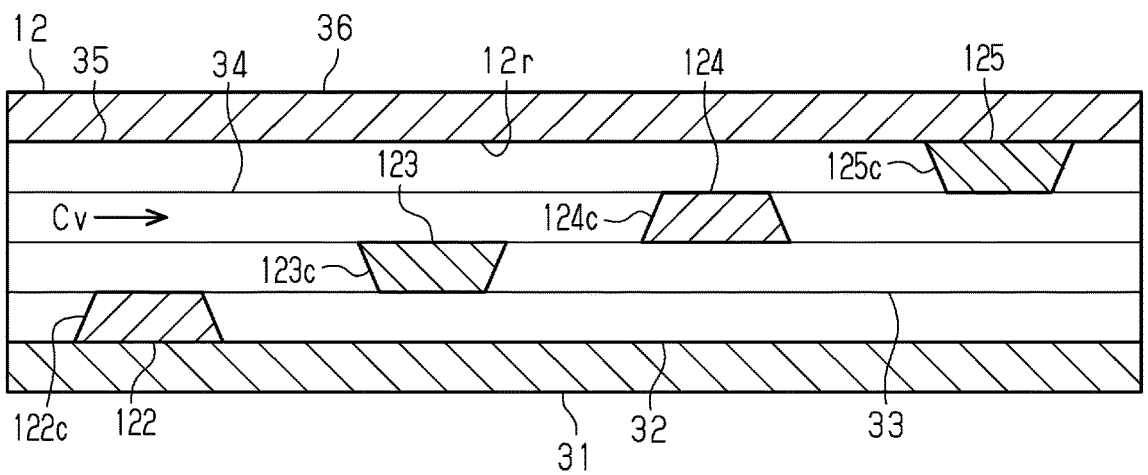

As illustrated in FIG. 8, the intermediate metal layers 32 to 35 respectively include joint beams 122 to 125. The joint beams 122 and 124 respectively include side surfaces 122c and 124c inclined inward from the lower surface toward the upper surface. The joint beams 123 and 125 respectively include side surfaces 123c and 125c inclined inward from the upper surface toward the lower surface. Such a configuration also controls the flow of the vapor Cv. Also, in the same manner as the joint beam 115 illustrated in FIG. 7, an obtuse angle is formed between the lower surface of the outermost metal layer 36 and the side surface 125c of the joint beam 125. Thus, the flowability of the vapor Cv is further improved.

Figure 9:
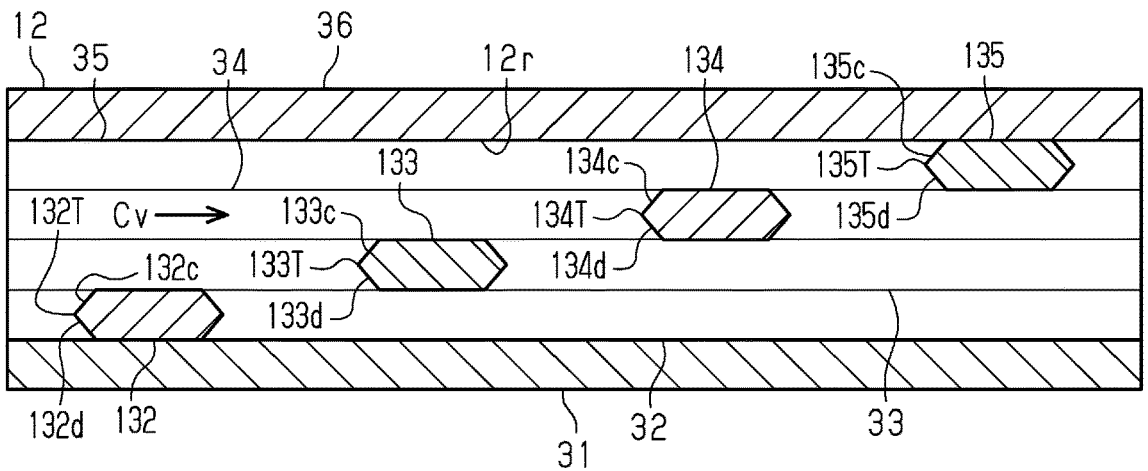

As illustrated in FIG. 9, the intermediate metal layers 32 to 35 respectively include joint beams 132 to 135. The joint beams 132 to 135 respectively include first side surfaces 132c, 133c, 134c, and 135c inclined in an outer direction from the upper surface toward the lower surface and second side surfaces 132d, 133d, 134d, and 135d inclined in the outer direction from the lower surface toward the upper surface. The first side surfaces 132c to 135c and the second side surfaces 132d to 135d include boundary portions including projections 132T, 133T, 134T, and 135T projecting in the outer direction. When flowing toward the joint beams 132 to 135, the vapor Cv flows from the projections 132T to 135T toward the upper side of the joint beams 132 to 135 along the first side surfaces 132c to 135c and also flows from the projections 132T to 135T toward the lower side of the joint beams 132 to 135 along the second side surfaces 132d to 135d. Such a configuration further improves the flowability of the vapor Cv. This improves the flow rate of the vapor Cv and increases the heat transfer efficiency.

Figure 10:
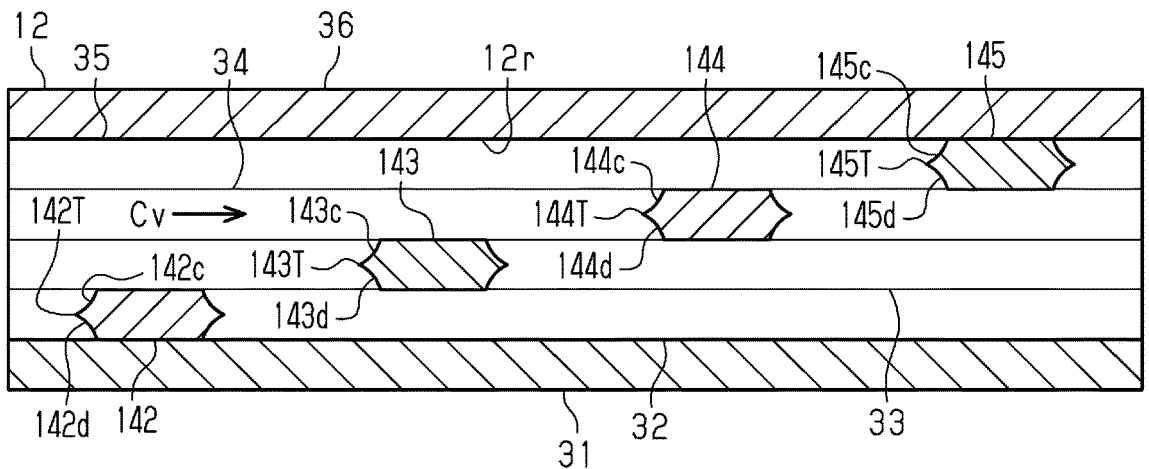

As illustrated in FIG. 10, the intermediate metal layers 32 to 35 respectively include joint beams 142 to 145. The joint beams 142 to 145 respectively include first side surfaces 142c, 143c, 144c, and 145c concave-curved and inclined from the upper surface toward the lower surface, second side surfaces 142d, 143d, 144d, and 145d concave-curved and inclined from the lower surface toward the upper surface, and projections 142T, 143T, 144T, and 145T formed in boundary portions of the first side surfaces 142c to 145c and the second side surfaces 142d to 145d. With such a configuration, the vapor Cv readily flows in the same manner as the joint beams 132 to 135 illustrated in FIG. 9. The inclination angles of the side surfaces 142c to 145c and 142d to 145d are more acute than those of the joint beams 132 to 135 illustrated in FIG. 9. This further improves the flow rate of the vapor Cv and increases the heat transfer efficiency.

Figure 11:
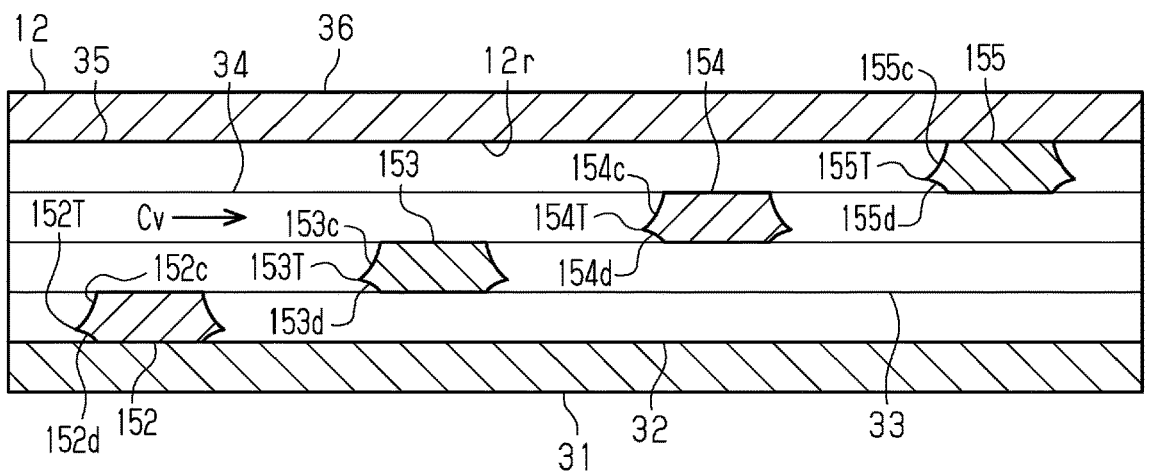

As illustrated in FIG. 11, the intermediate metal layers 32 to 35 respectively include joint beams 152 to 155. The joint beams 152 to 155 respectively include first side surfaces 152c, 153c, 154c, and 155c concave-curved and inclined from the upper surface toward the lower surface, second side surfaces 152d, 153d, 154d, and 155d concave-curved and inclined from the lower surface toward the upper surface, and projections 152T, 153T, 154T, and 155T formed in boundary portions of the first side surfaces 152c to 155c and the second side surfaces 152d to 155d. The first side surfaces 152c to 155c are greater in length from the upper end to the lower end than the second side surfaces 152d to 155d. Such joint beams 152 to 155 also further improve the flow rate of the vapor Cv and increase the heat transfer efficiency.

Figure 12:
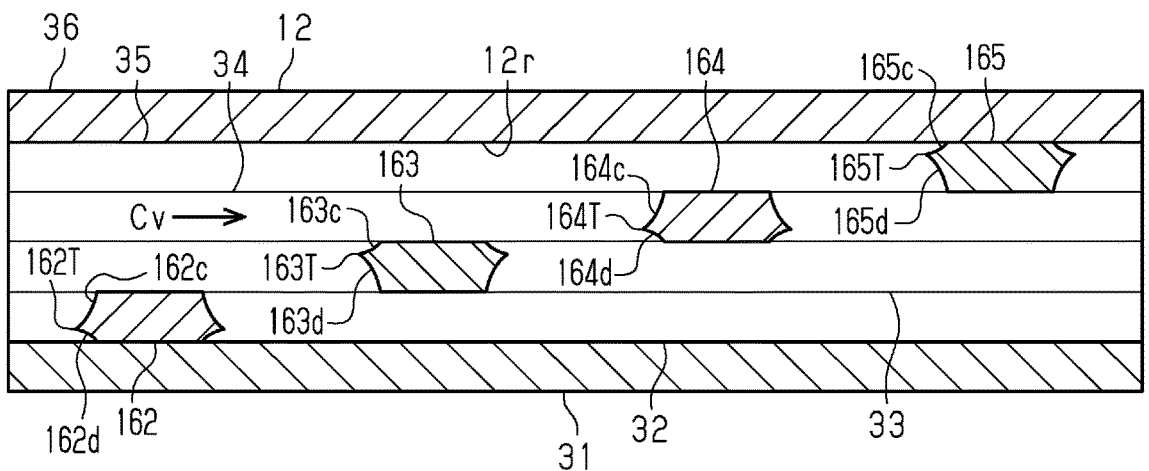

As illustrated in FIG. 12, the intermediate metal layers 32 to 35 respectively include joint beams 162 to 165. The joint beams 162 to 165 respectively include first side surfaces 162c, 163c, 164c, and 165c concave-curved and inclined from the upper surface toward the lower surface, second side surfaces 162d, 163d, 164d, and 165d concave-curved and inclined from the lower surface toward the upper surface, and projections 162T, 163T, 164T, and 165T formed in boundary portions of the first side surfaces 162c to 165c and the second side surfaces 162d to 165d. In the joint beams 162 and 164, the first side surfaces 162c and 164c are greater in length from the upper end to the lower end than the second side surfaces 162d and 164d. In the joint beams 163 and 165, the first side surfaces 163c and 165c are less in length from the upper end to the lower end than the second side surfaces 163d and 165d. Such joint beams 162 to 165 also further improve the flow rate of the vapor Cv and increase the heat transfer efficiency.

Second Embodiment

A second embodiment will now be described.

Figure 13:
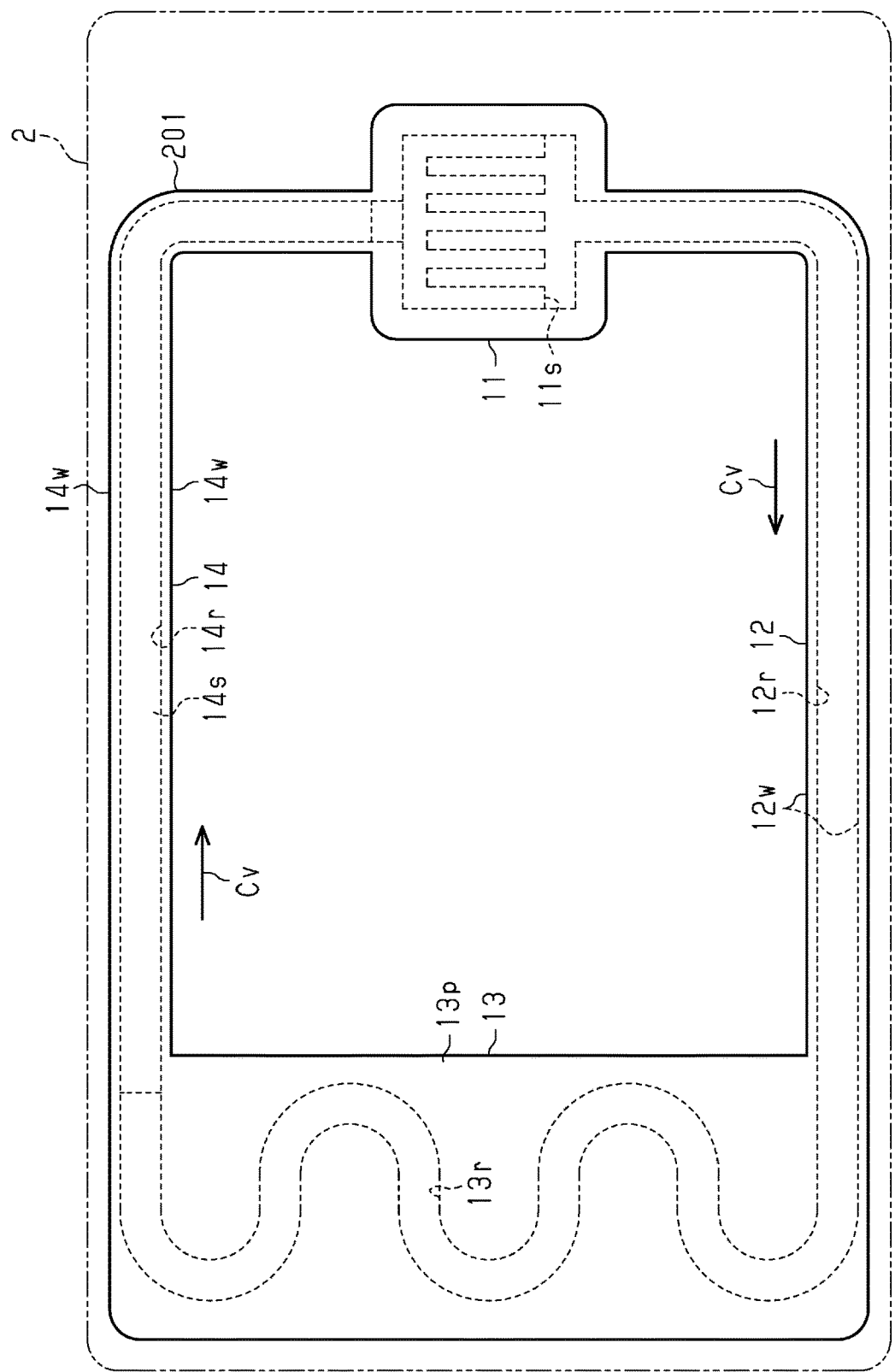
FIG. 13 is a schematic plan view illustrating a second embodiment of a loop heat pipe.

As illustrated in FIG. 13, a loop heat pipe 201 is, for example, accommodated in the mobile electronic device 2 such as a smartphone or a tablet terminal.

The loop heat pipe 201 includes the evaporator 11, the vapor pipe 12, the condenser 13, and the liquid pipe 14.

The evaporator 11 has a function to vaporize the working fluid C and generate the vapor Cv. The condenser 13 has a function to liquefy the vaporized working fluid C (i.e., vapor Cv). The vapor pipe 12 connects the evaporator 11 to the condenser 13 to transfer the vapor Cv to the condenser 13. The liquid pipe 14 connects the evaporator 11 to the condenser 13 to transfer the liquefied working fluid C to the evaporator 11. The vapor pipe 12 and the liquid pipe 14 together with the evaporator 11 and the condenser 13 form a loop flow passage through which the working fluid C or the vapor Cv flows.

In the present example, the liquid pipe 14 and the vapor pipe 12, for example, have the same length. However, the liquid pipe 14 and the vapor pipe 12 may have different lengths. For example, the vapor pipe 12 may be shorter than the liquid pipe 14.

The evaporator 11 is in close contact with and fixed to a heat-generating component (not illustrated). The evaporator 11 includes the wick 11s. The wick 11s is a capillary structural body that produces capillary force on the working fluid C. Heat generated in the heat-generating component vaporizes the working fluid C in the evaporator 11 to generate the vapor Cv. Thermal interface material (TIM) may be arranged between the evaporator 11 and the heat-generating component. The thermal interface material reduces a thermal contact resistance between the heat-generating component and the evaporator 11 and smoothly transfers heat from the heat-generating component to the evaporator 11.

The vapor pipe 12 includes the two pipe walls 12w located at opposite sides in the width-wise direction (vertical direction in FIG. 13) and the flow passage 12r located between the pipe walls 12w. The flow passage 12r is in communication with the inner void of the evaporator 11. The flow passage 12r is a portion of the loop flow passage described above. The vapor Cv generated in the evaporator 11 flows through the flow passage 12r of the vapor pipe 12 and is guided to the condenser 13.

The condenser 13 includes the heat dissipation plate 13p having a large area for heat dissipation and the flow passage 13r meandering through the heat dissipation plate 13p. The flow passage 13r is in communication with the flow passage 12r of the vapor pipe 12. The flow passage 13r is a portion of the loop flow passage described above. The condenser 13 liquefies the vapor Cv guided to the flow passage 13r via the vapor pipe 12.

The liquid pipe 14 includes the two pipe walls 14w located at opposite sides in the width-wise direction (vertical direction in FIG. 13), the flow passage 14r located between the pipe walls 14w, and the wick 14s arranged in the flow passage 14r. The flow passage 14r is in communication with the flow passage 13r of the condenser 13 and the inner void of the evaporator 11. The flow passage 14r is a portion of the loop flow passage described above. The wick 14s extends from the condenser 13 to the evaporator 11 along the liquid pipe 14. The wick 14s is a capillary structural body that produces capillary force on the working fluid C. The wick 14s uses the capillary force generated in the wick 14s to guide the working fluid C liquefied by the condenser 13 to the evaporator 11.

Preferably, fluid having a high vapor pressure and a high latent heat of vaporization is used as the working fluid C. The use of such a working fluid C efficiently cools the heat-generating component with the latent heat of vaporization. Examples of the working fluid C include ammonia, water, chlorofluorocarbon, alcohol, and acetone.

The loop heat pipe 201 may be, for example, formed by a metal layer stack including multiple metal layers. In a non-restrictive example, the loop heat pipe 201 is formed by a metal layer stack of the six metal layers 31 to 36 (for example, refer to FIGS. 15 to 17) so that the metal layer stack includes the evaporator 11, the vapor pipe 12, the condenser 13, and the liquid pipe 14. The metal layers 31 to 36 are, for example, copper layers having superior thermal conductance and directly bonded with each other through solid-phase bonding or the like. The metal layers 31 to 36 may each have a thickness of, for example, approximately 50 μm to 200 μm. The metal layers 31 to 36 are not limited to copper layers and may be stainless layers, aluminum layers, magnesium alloy layers, or the like. Additionally, the number of stacked metal layers is not particularly limited. One or more of the metal layers 31 to 36 may be formed from a material differing from the material of the other metal layers.

The structure of the metal layer stack (metal layers 31 to 36) of the loop heat pipe 201 will now be described using the vapor pipe 12 as an example.

Figure 15:
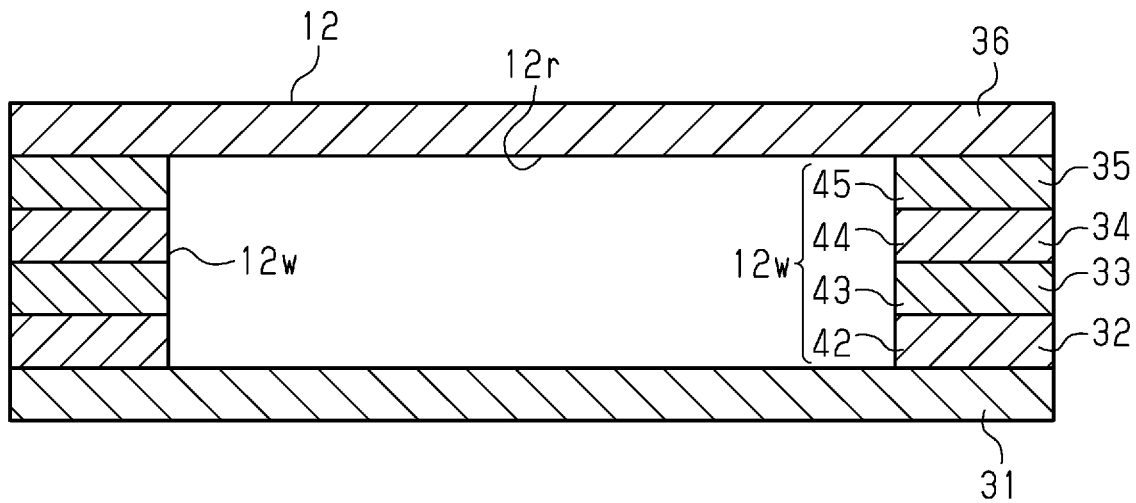
FIG. 15 is a schematic cross-sectional view of the vapor pipe illustrated in FIG. 14.

As illustrated in FIG. 15, the vapor pipe 12 has a structure in which, for example, the metal layers 31 to 36 are sequentially stacked. The metal layer 31 may be referred to as the outermost metal layer 31 (or lowermost metal layer 31). The metal layer 36 may be referred to as the outermost metal layer 36 (or uppermost metal layer 36). The metal layers 32 to 35 may be referred to as the intermediate metal layers 32 to 35. When there is no need to distinguish the outermost metal layers from the intermediate metal layers, the metal layers will simply be referred to as the metal layers 31 to 36. In FIG. 15 (and other drawings), to facilitate understanding, the metal layers 31 to 36 are distinguished from one another by solid lines and indicated by different hatching lines. However, when integrating the metal layers 31 to 36 through, for example, diffusion bonding, the interfaces of the metal layers 31 to 36 will be eliminated, and the boundaries of the metal layers 31 to 36 may not be clear.

The outermost metal layers 31 and 36 are arranged at outermost sides of the metal layer stack including the metal layers 31 to 36. The intermediate metal layers 32 to 35 are arranged between the outermost metal layer 31 and the outermost metal layer 36. Thus, the loop heat pipe 201 including the vapor pipe 12 includes the two outermost metal layers 31 and 36 and the intermediate metal layers 32 to 35 stacked between the two outermost metal layers 31 and 36. The outermost metal layers 31 and 36 are solid and free from holes and pits. The intermediate metal layers 32 to 35 respectively include the walls 42, 43, 44, and 45 forming the pipe walls 12w of the vapor pipe 12.

Although not illustrated in the drawings, the evaporator 11, the condenser 13, and the vapor pipe 12, which are illustrated in FIG. 13, are formed by the metal layers 31 to 36 stacked as described above.

Figure 14:
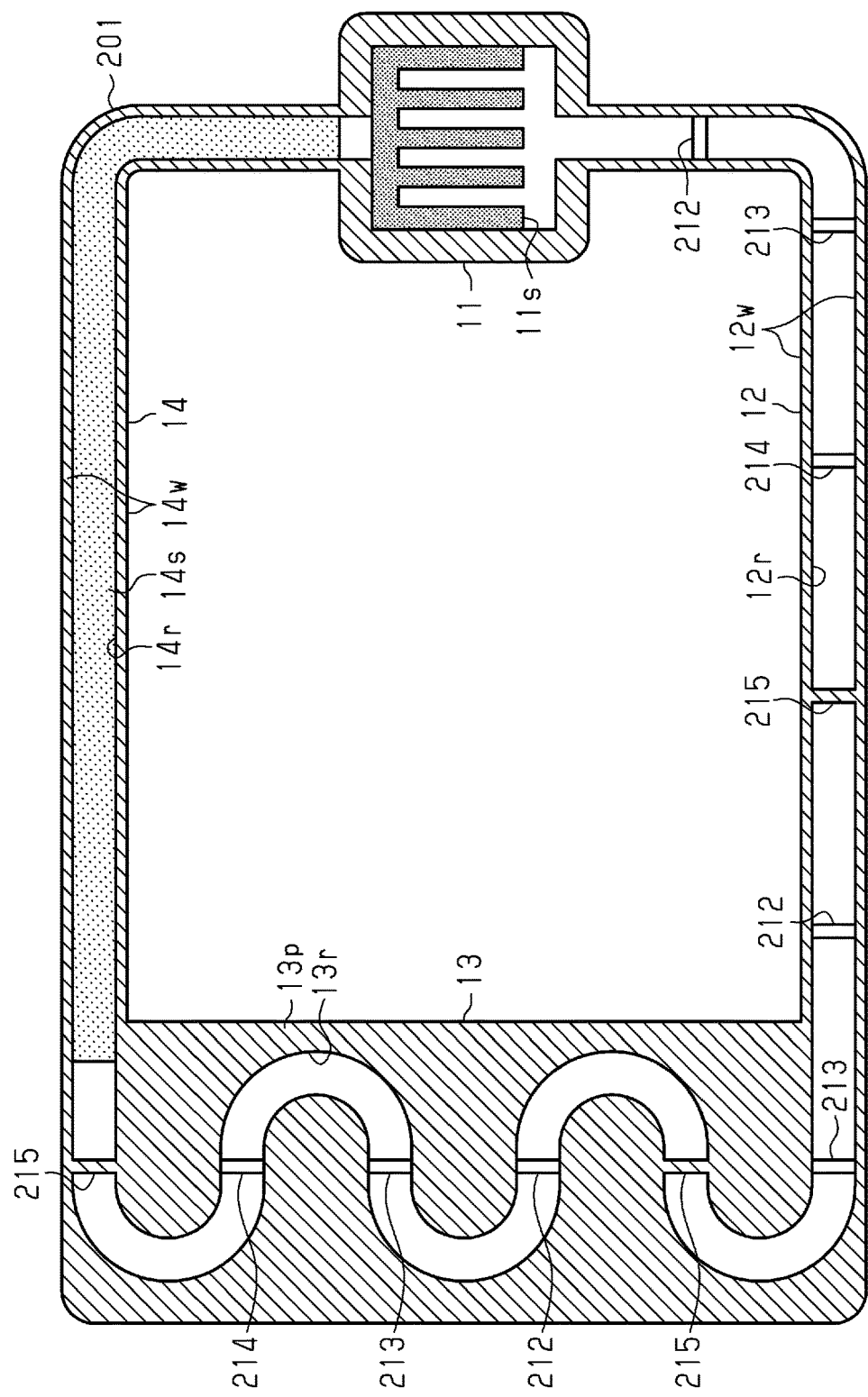
FIG. 14 is a schematic plan view of the loop heat pipe illustrated in FIG. 13 from which the uppermost metal layer is removed.

FIG. 14 illustrates the loop heat pipe 201 from which the uppermost metal layer 36 is removed.

The vapor pipe 12 includes joint beams 212, 213, 214, and 215 arranged in the flow passage 12r. In the same manner, the condenser 13 includes joint beams 212 to 215 arranged in the flow passage 13r.

In the vapor pipe 12, each of the joint beams 212 to 215 joins the two pipe walls 12w, which are located at opposite sides of the flow passage 12r. In the same manner, in the condenser 13, each of the joint beams 212 to 215 joins two pipe walls (inner walls of the heat dissipation plate 13p) located at opposite sides of the flow passage 13r.

In each of the vapor pipe 12 and the condenser 13, the joint beams 212 to 215 are arranged in positions that do not overlap with each other in a plan view (i.e., thickness-wise direction of the metal layers 31 to 36). Thus, the flow passage 12r of the vapor pipe 12 and the flow passage 13r of the condenser 13 are not closed.

The joint beams 212 to 215 of the vapor pipe 12 will now be described. In the following description, the flow passage 12r and the configuration related to the flow passage 12r may be replaced with the flow passage 13r and the configuration related to the flow passage 13r so that the joint beams 212 to 215 of the condenser 13 have substantially the same configuration as the joint beams 212 to 215 of the vapor pipe 12. The joint beam 215 will now be described.

Figure 16:
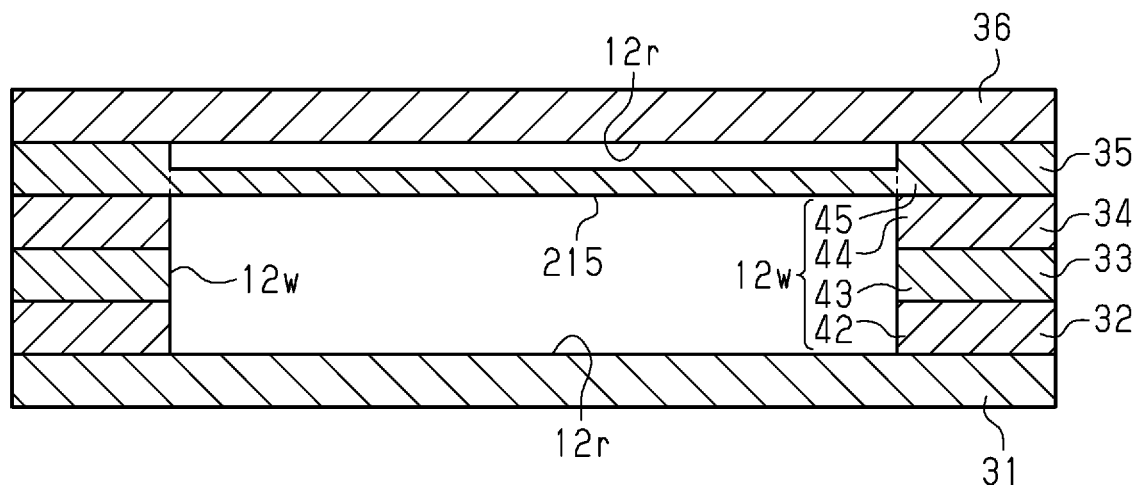
FIG. 16 is a schematic cross-sectional view of a portion of the vapor pipe illustrated in FIG. 14 including a joint beam.

As illustrated in FIG. 16, the intermediate metal layer 35 includes the joint beam 215. In the present example, the entire joint beam 215 is thinner than the walls 45 of the intermediate metal layer 35. Thus, at the position of the joint beam 215, the flow passage 12r includes a flow passage space surrounded by the two pipe walls 12w, the outermost metal layer 31, and the joint beam 215 and a flow passage space surrounded by the two pipe walls 12w, the outermost metal layer 36, and the joint beam 215. As compared to the first embodiment, the cross-sectional area of the flow passage 12r is increased in a plane that is orthogonal to the direction in which the vapor Cv flows.

Figure 17:
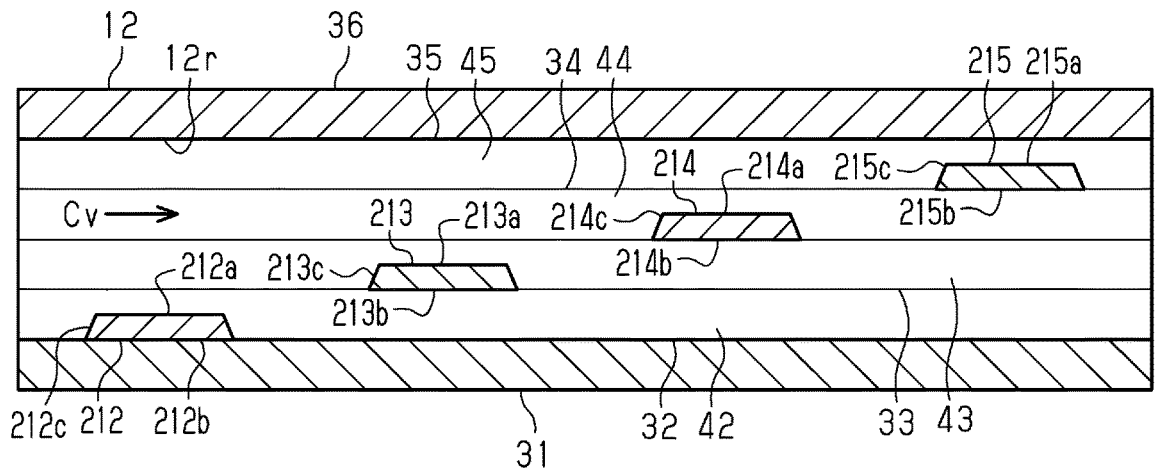
FIG. 17 is a schematic cross-sectional view of the vapor pipe illustrated in FIG. 14 taken in a direction along a flow passage.

As illustrated in FIG. 17, the joint beam 215 includes an upper surface 215a, a lower surface 215b, and two side surfaces 215c. In the joint beam 215, the width (dimension in sideward direction in FIG. 17) of the upper surface 215a is smaller than the width of the lower surface 215b. Each side surface 215c includes an inclined surface inclined from the lower surface 215b toward the upper surface 215a.

The joint beams 212 to 214 are formed in the same manner as the joint beam 215. In the present example, as illustrated in FIG. 17, the intermediate metal layers 32 to 34 respectively include the joint beams 212 to 214. The joint beams 212 to 214 are entirely thinner than the walls 42 to 44 of the intermediate metal layers 32 to 34. The joint beams 212 to 214 respectively include upper surfaces 212a to 214a, lower surfaces 212b to 214b, and side surfaces 212c to 214c. Each of the side surfaces 212c to 214c includes an inclined surface inclined from the lower surfaces 212b to 214b toward the upper surfaces 212a to 214a.

In the vapor pipe 12, the vapor Cv (vaporized working fluid C) flows from the left side toward the right side along the flow passage 12r as indicated by the arrow in FIG. 17. Thus, the side surfaces 212c to 215c of the joint beams 212 to 215 are inclined from the direction in which the vapor Cv flows through the flow passage 12r.

At the position of the joint beam 212, the flow passage 12r includes a flow passage space surrounded by the two pipe walls 12w (refer to FIG. 16), the joint beam 212, and the outermost metal layer 36. At the position of the joint beam 213, the flow passage 12r includes a flow passage space surrounded by the two pipe walls 12w, the joint beam 213, and the outermost metal layer 31 and a flow passage space surrounded by the two pipe walls 12w, the joint beam 213, and the outermost metal layer 36. At the position of the joint beam 214, the flow passage 12r includes a flow passage space surrounded by the two pipe walls 12w, the joint beam 214, and the outermost metal layer 31 and a flow passage space surrounded by the two pipe walls 12w, the joint beam 214, and the outermost metal layer 36. The joint beam 212 may be spaced apart from the outermost metal layer 31 so that the flow passage 12r includes a flow passage space surrounded by the two pipe walls 12w, the joint beam 212, and the outermost metal layer 31 at the position of the joint beam 212.

The second embodiment has the advantages described below.

(2-1) The loop heat pipe 201 includes the metal layer stack including the outermost metal layers 31 and 36 and the intermediate metal layers 32 to 35 stacked between the outermost metal layers 31 and 36. The metal layer stack includes the evaporator 11 vaporizing the working fluid C, the condenser 13 liquefying the vaporized working fluid C (vapor Cv), the vapor pipe 12 connecting the evaporator 11 to the condenser 13, and the liquid pipe 14 connecting the condenser 13 to the evaporator 11. The vapor pipe 12 includes the two pipe walls 12w defining the flow passage 12r and the joint beams 212 to 215 arranged at different positions along the flow passage 12r. Each of the joint beams 212 to 215 joins the two pipe walls 12w to each other. Each of the intermediate metal layers 32 to 35 includes one of the joint beams 212 to 215. The side surfaces 212c to 215c of the joint beams 212 to 215 are inclined from the direction in which the vapor Cv flows through the flow passage 12r. With this structure, although the vapor pipe 12 includes the joint beams 212 to 214, the vapor Cv readily flows along the side surfaces 212c to 214c. This improves the flow rate of the vapor Cv in the vapor pipe 12 and increases the heat transfer efficiency.

(2-2) The joint beams 212 to 215 are thinner than the walls 42 to 45 of the intermediate metal layers 32 to 35. Thus, as compared to the first embodiment, the cross-sectional area of the flow passage 12r is increased in a plane that is orthogonal to the direction in which the vapor Cv flows. Thus, the vapor Cv further readily flows. This further improves the flow rate of the vapor Cv and increases the heat transfer efficiency.

(2-3) The joint beam 215 is spaced apart from the outermost metal layer 36 and forms a flow passage space in which the working fluid C (vapor Cv) flows. Thus, even if the vapor Cv is liquefied in the vapor pipe 12, accumulation of the liquid between the joint beam 215 and the outermost metal layer 36 is limited. This maintains a satisfactory circulation of the working fluid and increases the heat transfer efficiency.

Modified Examples of Second Embodiment

The second embodiment may be modified as follows. The modified examples described below relate to joint beams of the vapor pipe 12. Thus, the drawings illustrate components related to the joint beams and do not illustrate other components. The same reference characters are given to those components that are the same as the corresponding components of the second embodiment. Such components will partially or entirely not be described. The following modified examples are applicable to the joint beams of the condenser 13.

Figure 18:
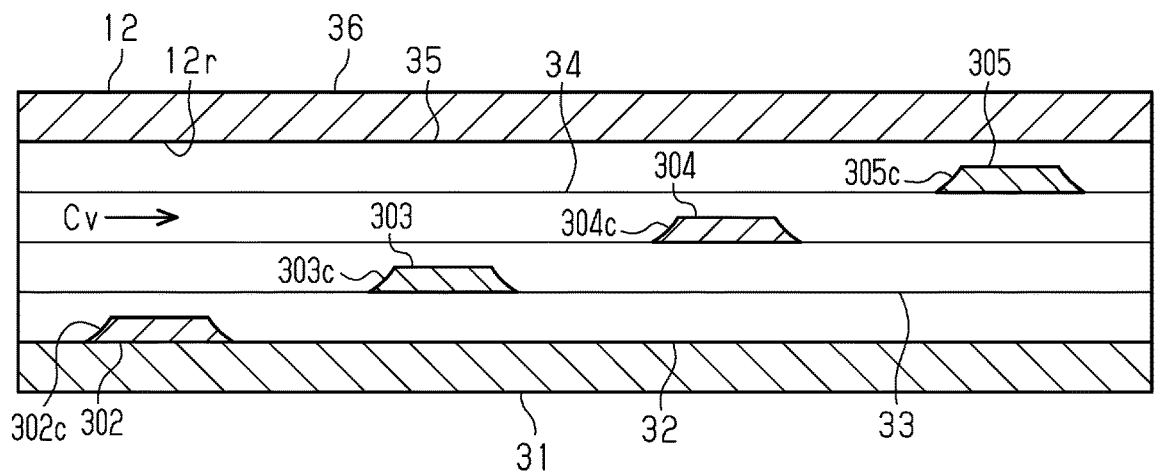
FIGS. 18 to 30 are schematic cross-sectional views of various modified examples of vapor pipes in a direction along a flow passage.

As illustrated in FIG. 18, the intermediate metal layer 32 includes the two walls 42 (refer to FIG. 16) and a joint beam 302 joining the walls 42 to each other. Also, in the same manner as the intermediate metal layer 32, the intermediate metal layers 33 to 35 respectively include the walls 43 to 45 and joint beams 303 to 305. The joint beams 302 to 305 respectively include concave-curved side surfaces 302c, 303c, 304c, and 305c. With such concave-curved side surfaces 302c to 305c, the vapor Cv readily flows. This improves the flow rate of the vapor Cv and increases the heat transfer efficiency. In the same manner as the second embodiment, the joint beams 302 to 305 are entirely thinner than the walls 42 to 45. Thus, the flow passage space is sufficiently obtained. This maintains a satisfactory circulation of the working fluid and increases the heat transfer efficiency. Additionally, the joint beam 302 of the intermediate metal layer 32 may be spaced apart from the outermost metal layer 31 to form a flow passage space in which the working fluid C (vapor Cv) flows.

Figure 19:
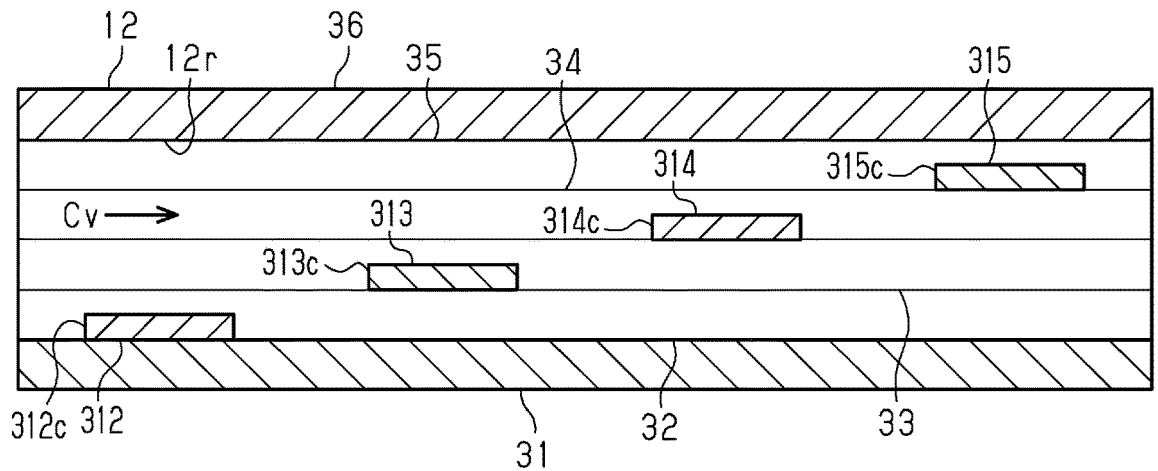

As illustrated in FIG. 19, the intermediate metal layers 32 to 35 respectively include joint beams 312 to 315. The joint beams 312 to 315 respectively include side surfaces 312c, 313c, 314c, and 315c extending in the thickness-wise direction of the intermediate metal layers 32 to 35. The side surfaces 312c to 315c extend orthogonal to the direction in which the vapor Cv flows. Even when the side surfaces 312c to 315c have such a configuration, the flow passage space is sufficiently obtained because the joint beams 312 to 315 are entirely thinner than the walls 42 to 45. This improves the flow rate of the vapor Cv and maintains a satisfactory circulation of the working fluid. Thus, the heat transfer efficiency is increased. The joint beam 312 of the intermediate metal layer 32 may be spaced apart from the outermost metal layer 31 to form a flow passage space in which the working fluid C (vapor Cv) flows.

Figure 20:
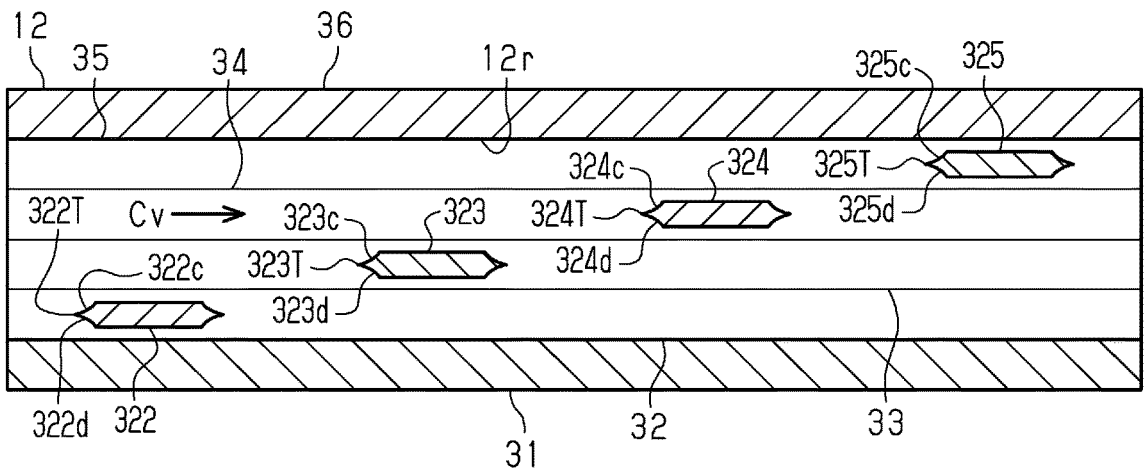

As illustrated in FIG. 20, the intermediate metal layers 32 to 35 respectively include joint beams 322 to 325. The joint beams 322 to 325 respectively include first side surfaces 322c, 323c, 324c, and 325c concave-curved and inclined from the upper surface toward the lower surface and second side surfaces 322d, 323d, 324d, and 325d concave-curved and inclined from the lower surface toward the upper surface.

Further, the joint beams 322 to 325 respectively include projections 322T, 323T, 3241, and 325T formed in boundary portions of the first side surfaces 322c to 325c and the second side surfaces 322d to 325d and projecting in the outer direction. Thus, when flowing toward the joint beams 322 to 325, the vapor Cv flows from the projections 322T to 325T toward the upper side of the joint beams 322 to 325 along the first side surfaces 322c to 325c and also flows from the projections 322T to 325T toward the lower side of the joint beams 322 to 325 along the second side surfaces 322d to 325d. With such a configuration, the flowability of the vapor Cv is further improved. This improves the flow rate of the vapor Cv and increases the heat transfer efficiency. Additionally, the joint beams 322 to 325 are entirely thinner than the walls 42 to 45. Thus, the flow passage space is sufficiently obtained in the same manner as the second embodiment. This maintains a satisfactory circulation of the working fluid and increases the heat transfer efficiency.

Figure 21:
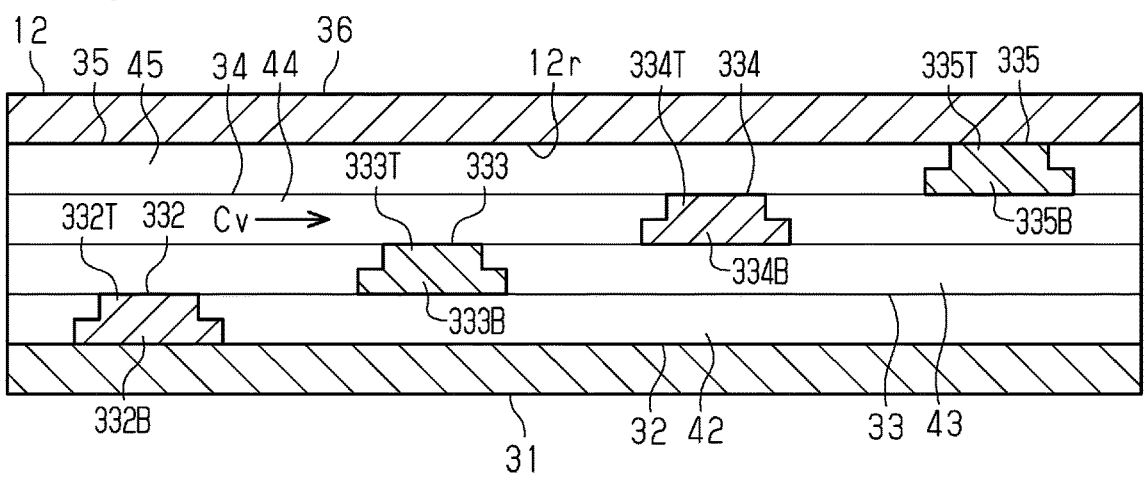

As illustrated in FIG. 21, the intermediate metal layers 32 to 35 respectively include joint beams 332 to 335. The joint beam 332 includes a base 332B, which is thinner than the walls 42 of the intermediate metal layer 32, and a protrusion 332T arranged on the base 332B. The protrusion 332T is arranged on a central position of the base 332B in the width-wise direction (sideward direction in FIG. 21). The thickness of the combination of the base 332B and the protrusion 332T is equal to the thickness of the walls 42. However, the thickness of the combination of the base 332B and the protrusion 332T may be less than the thickness of the wall 42. The protrusion 332T is connected to the two walls 42.

In the same manner as the joint beam 332, the joint beams 333 to 335 respectively include bases 333B, 334B, and 335B and protrusions 333T, 3341, and 335T. With such a configuration, portions (i.e., steps of bases and protrusions) of the joint beams 332 to 335 are thinner than the walls 42 to 45 of the intermediate metal layers 32 to 35. Thus, the flow of the vapor Cv is regulated. This improves the flow rate of the vapor Cv and increases the heat transfer efficiency. Further, the combination of the bases 332B to 335B and the protrusions 332T to 335T increases the strength of the joint beams 332 to 335.

Figure 22:
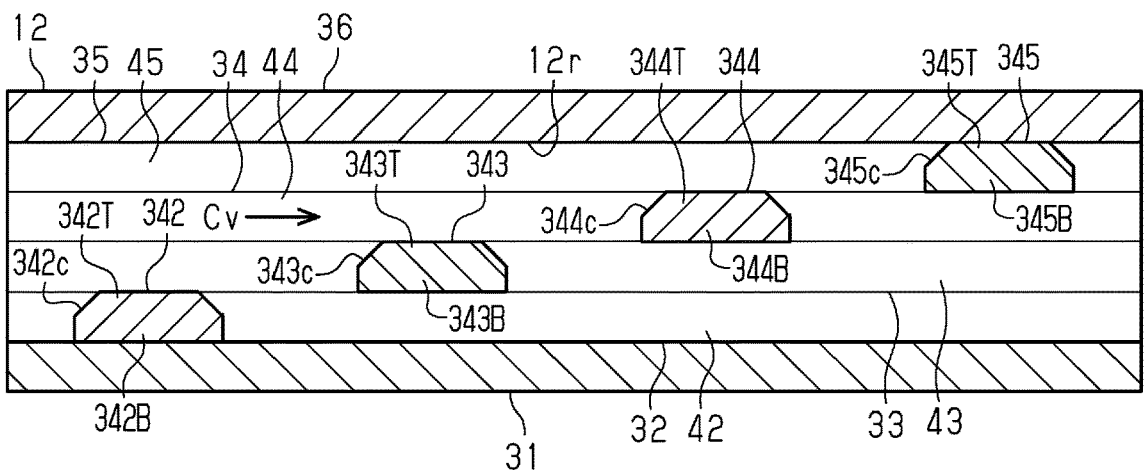

As illustrated in FIG. 22, the intermediate metal layers 32 to 35 respectively include joint beams 342 to 345. The joint beam 342 includes a base 342B, which is thinner than the walls 42 of the intermediate metal layer 32, and a protrusion 3421 arranged on the base 342B. The protrusion 3421 is arranged on a central position of the base 342B in the width-wise direction (sideward direction in FIG. 22). The thickness of the combination of the base 342B and the protrusion 3421 is equal to the thickness of the walls 42. However, the thickness of the combination of the base 342B and the protrusion 3421 may be less than the thickness of the walls 42. The protrusion 3421 includes two side surfaces 342c inclined in the outer direction from the upper end of the protrusion 3421 toward the upper end of the base 342B.

In the same manner as the joint beam 342, the joint beams 343 to 345 respectively include bases 343B, 344B, and 345B and protrusions 343T, 344T, and 345T. The protrusions 343T to 345T respectively include side surfaces 343c to 345c. With such a configuration, portions of the joint beams 342 to 345 (i.e., portions of side surfaces (inclined surfaces) 342c to 345c) are thinner than the walls 42 to 45 of the intermediate metal layers 32 to 35. Thus, the vapor Cv readily flows. This improves the flow rate of the vapor Cv and increases the heat transfer efficiency. Further, the combination of the bases 342B to 345B and the protrusions 3421 to 3451 increases the strength of the joint beams 342 to 345.

Figure 23:
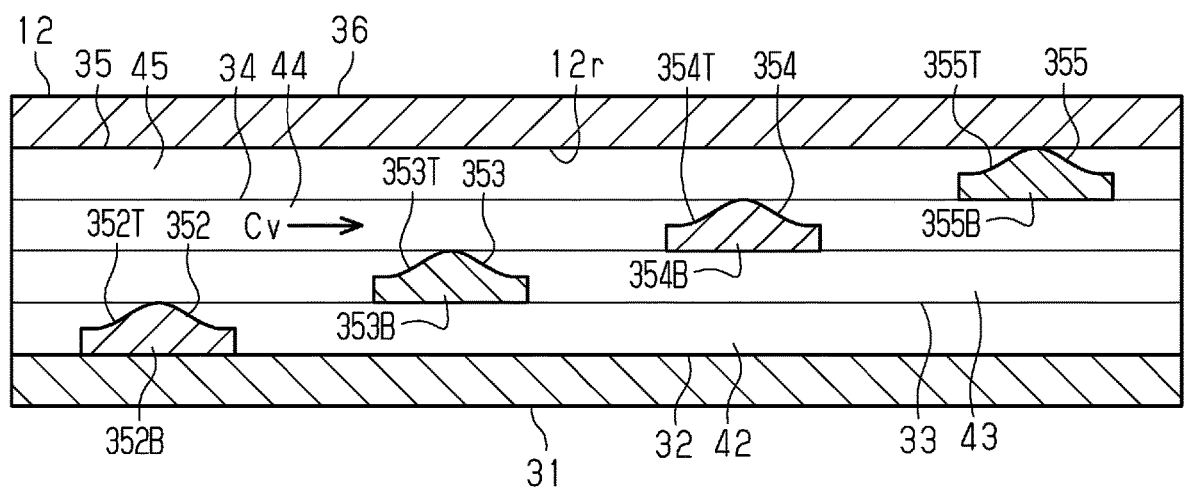

As illustrated in FIG. 23, the intermediate metal layers 32 to 35 respectively include joint beams 352 to 355. The joint beam 352 includes a base 352B, which is thinner than the walls 42 of the intermediate metal layer 32, and a protrusion 352T arranged on the base 352B. The protrusion 352T is arranged on a central position of the base 352B in the width-wise direction (sideward direction in FIG. 23). The thickness of the combination of the base 352B and the protrusion 352T is equal to the thickness of the walls 42. However, the thickness of the combination of the base 352B and the protrusion 352T may be less than the thickness of the walls 42. The protrusion 352T includes two side surfaces. The side surfaces are concave-curved and inclined from opposite ends of the base 352B in the width-wise direction toward a top of the protrusion 352T and are joined to each other to have a curved surface at the top.

In the same manner as the joint beam 352, the joint beams 353 to 355 respectively include bases 353B, 354B, and 355B and protrusions 353T, 3541, and 355T. The protrusions 353T to 355T respectively include side surfaces that are concave-curved and inclined. Even with such a configuration, the vapor Cv readily flows because portions of the joint beams 352 to 355 (i.e., portions of concave-curved surfaces (inclined surfaces)) are thinner than the walls 42 to 45 of the intermediate metal layers 32 to 35. This improves the flow rate of the vapor Cv and increases the heat transfer efficiency. Further, the combination of the bases 352B to 355B and the protrusions 352T to 355T increases the strength of the joint beams 352 to 355.

Figure 24:
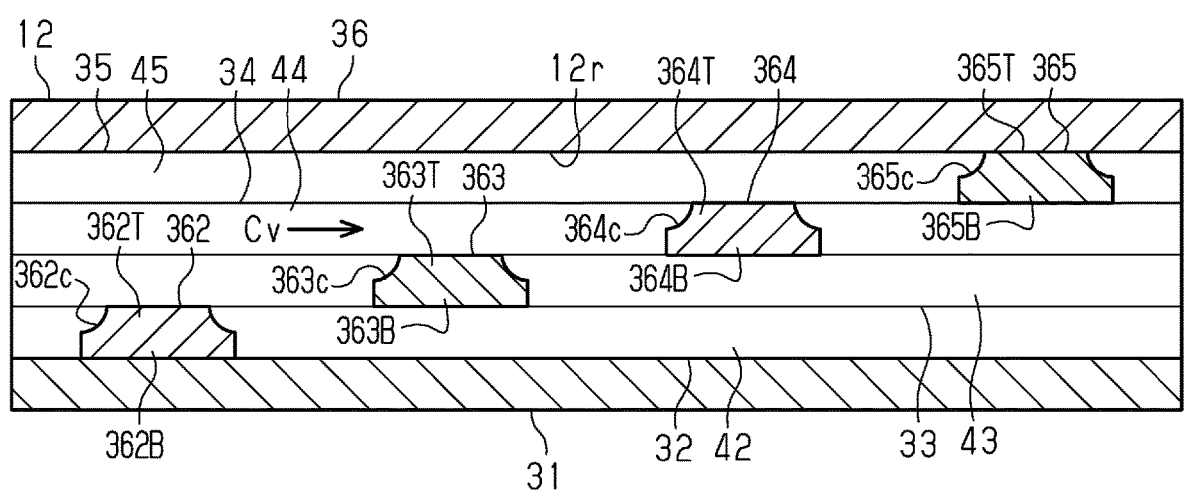

As illustrated in FIG. 24, the intermediate metal layers 32 to 35 respectively include joint beams 362 to 365. The joint beam 362 includes a base 362B, which is thinner than the walls 42 of the intermediate metal layer 32, and a protrusion 362T arranged on the base 362B. The protrusion 362T is arranged on a central portion of the base 362B in the width-wise direction (sideward direction in FIG. 24). The thickness of the combination of the base 362B and the protrusion 362T is equal to the thickness of the walls 42. However, the thickness of the combination of the base 362B and the protrusion 362T may be less than the thickness of the walls 42. The protrusion 362T includes two side surfaces 362c. The side surfaces 362c are concave-curved and inclined from the upper end of the protrusion 362T toward the upper end of the base 362B.

In the same manner as the joint beam 362, the joint beams 363 to 365 respectively include bases 363B, 364B, and 365B and protrusions 363T, 364T, and 365T. The protrusions 363T to 355T respectively include side surfaces 363c, 364c, and 365c that are concave-curved and inclined. Even with such a configuration, portions of the joint beams 362 to 365 (i.e., portions of side surfaces (concave-curved surfaces) 362c to 365c) are thinner than the walls 42 to 45 of the intermediate metal layers 32 to 35. Thus, the vapor Cv readily flows. This improves the flow rate of the vapor Cv and increases the heat transfer efficiency. Further, the combination of the bases 362B to 365B and the protrusions 362T to 365T increases the strength of the joint beams 362 to 365.

Figure 25:
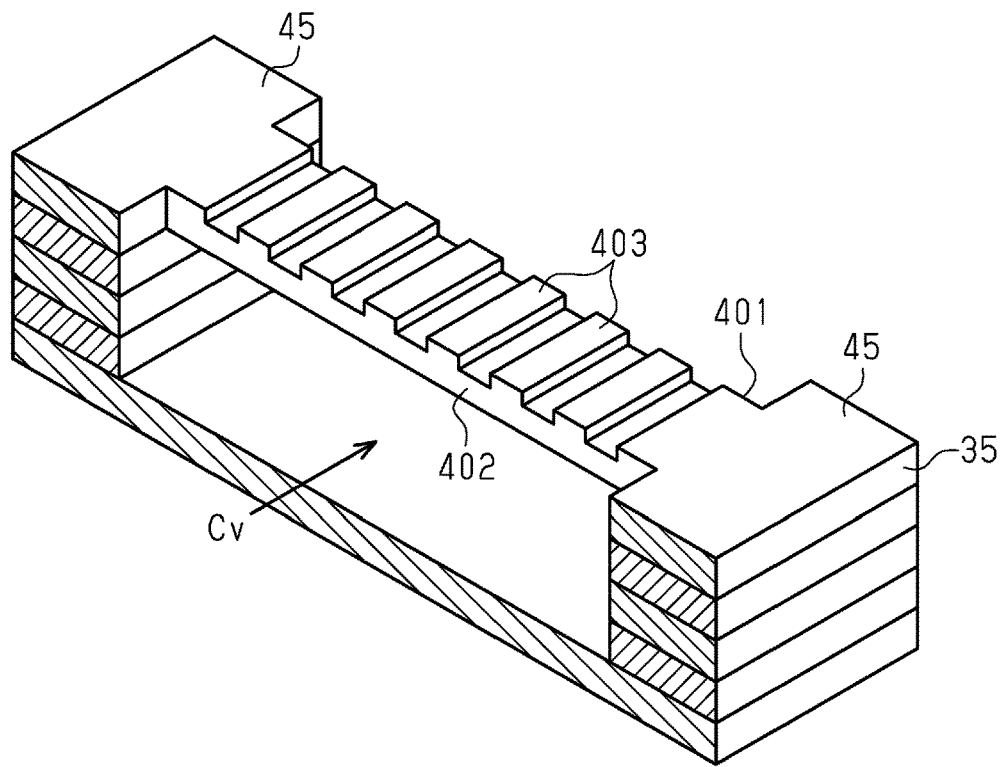

As illustrated in FIG. 25, the intermediate metal layer 35 includes a joint beam 401. The joint beam 401 includes a base 402, which is thinner than the walls 45 of the intermediate metal layer 35, and protrusions 403 arranged on the base 402. The protrusions 403 extend between opposite ends of the base 402 in the width-wise direction. The joint beam 401, which includes the base 402 and the protrusions 403, allows the vapor Cv to readily flow. This improves the flow rate of the vapor Cv and increases the heat transfer efficiency.

Figure 26:
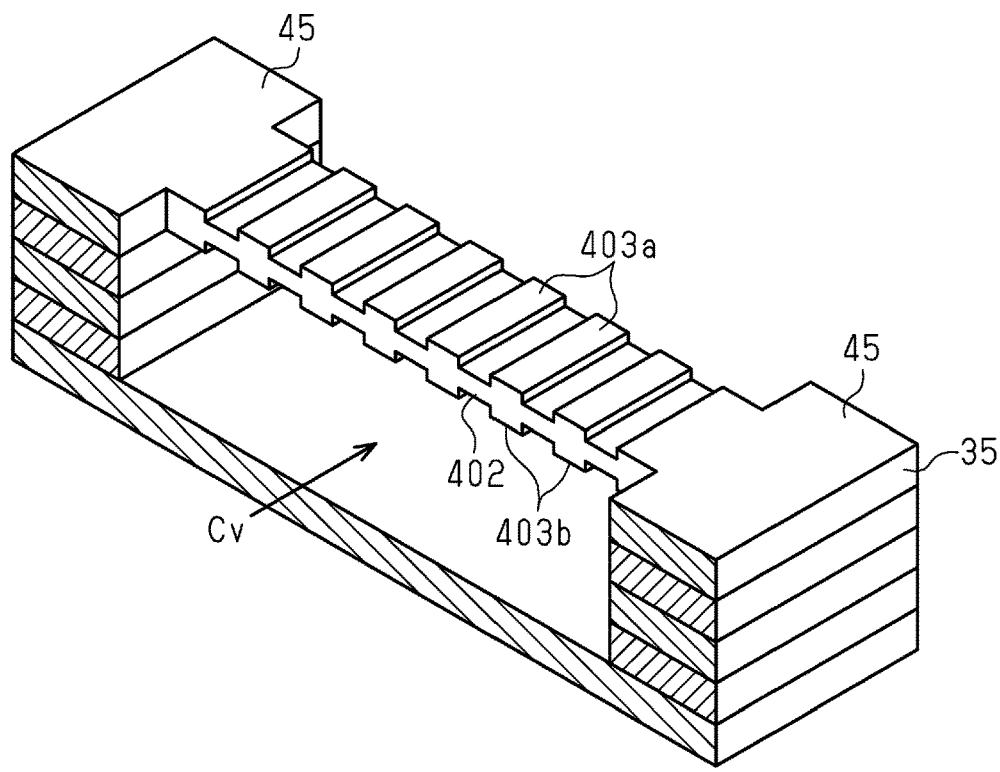

As illustrated in FIG. 26, the upper surface and the lower surface of the base 402 may include protrusions 403a and 403b. In FIG. 26, the protrusions 403a and 403b are located at positions overlapping with each other in a plan view (thickness-wise direction of intermediate metal layer 35) but may be located at positions partially overlapping with each other or positions that do not overlap with each other.

Figure 27:
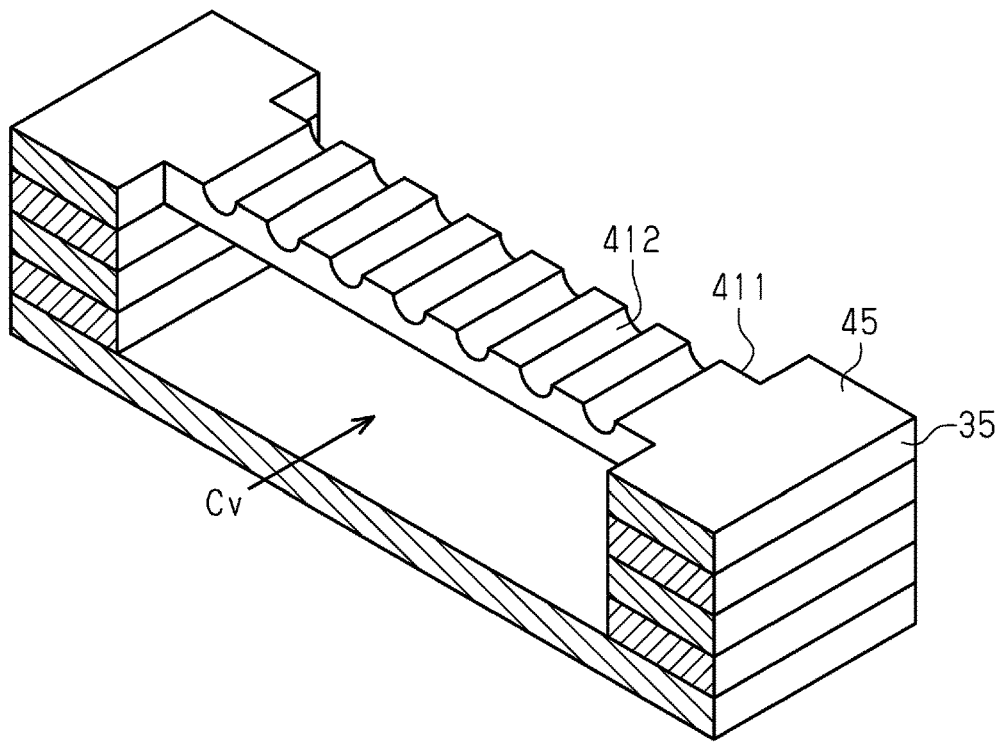

As illustrated in FIG. 27, grooves 412 may extend in a joint beam 411 between opposite ends in the width-wise direction so that the joint beam 411 has portions thinner than the walls 45 of the intermediate metal layer 35. Each groove 412 is, for example, semicircular in a cross-sectional view.

Figure 28:
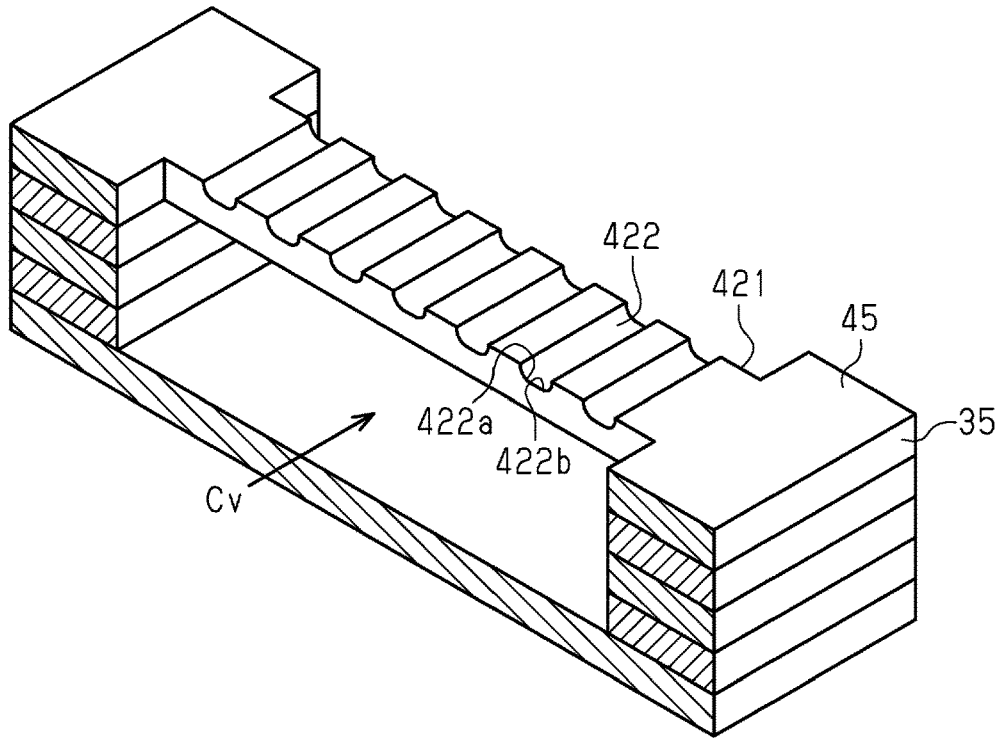

As illustrated in FIG. 28, grooves 422 may extend in a joint beam 421 between opposite ends in the width-wise direction so that the joint beam 421 has portions thinner than the walls 45 of the intermediate metal layer 35. Each groove 422 includes a side surface 422a and a bottom surface 422b that are arcuate and continuous with each other.

Figure 29:
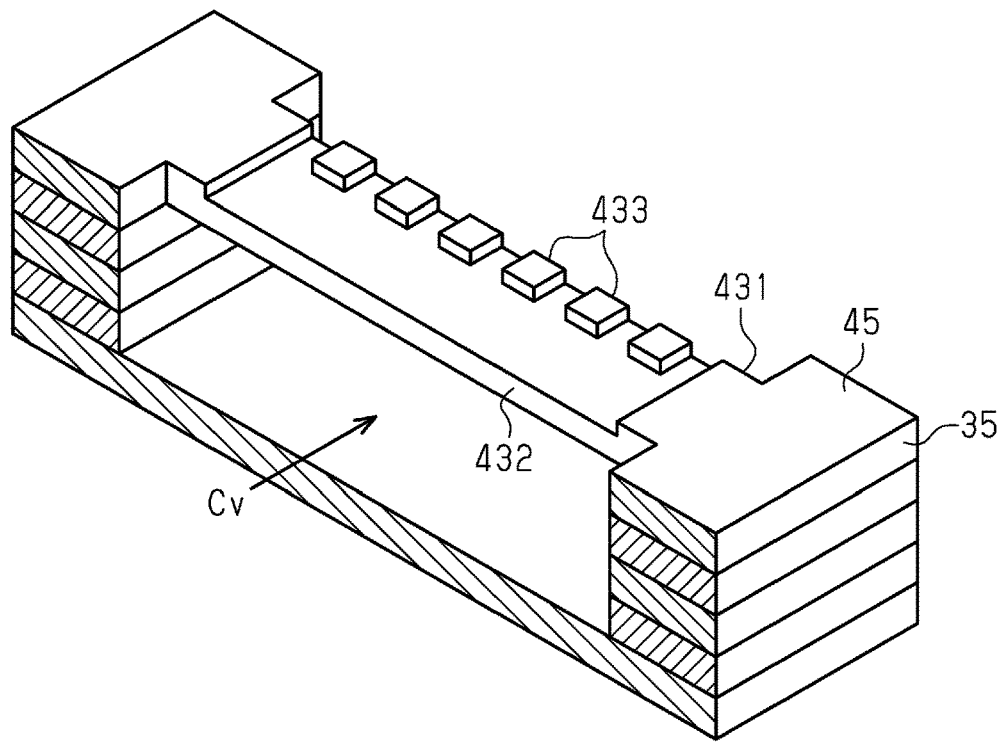

As illustrated in FIG. 29, the intermediate metal layer 35 includes a joint beam 431. The joint beam 431 includes a base 432, which is thinner than the walls 45 of the intermediate metal layer 35, and protrusions 433 arranged on the base 432. The protrusions 433 are arranged on the upper surface of the base 432 between the two walls 45. Each protrusion 433 is shorter than the width-wise dimension of the joint beam 431. In the example illustrated in FIG. 29, the protrusions 433 are arranged on a rear end of the base 432 in the direction in which the vapor Cv flows. However, the protrusions 433 may be arranged on any position such as a front end or a central portion of the base 432 in the direction in which the vapor Cv flows. Further, the protrusions 433 may be arranged at different position in the direction in which the vapor Cv flows. The joint beam 431, which includes the base 432 and the protrusions 433, allows the vapor Cv to readily flow. The protrusions 433 may be arranged on the lower surface of the base 432 or may be arranged on both the upper surface and the lower surface.

Figure 30:
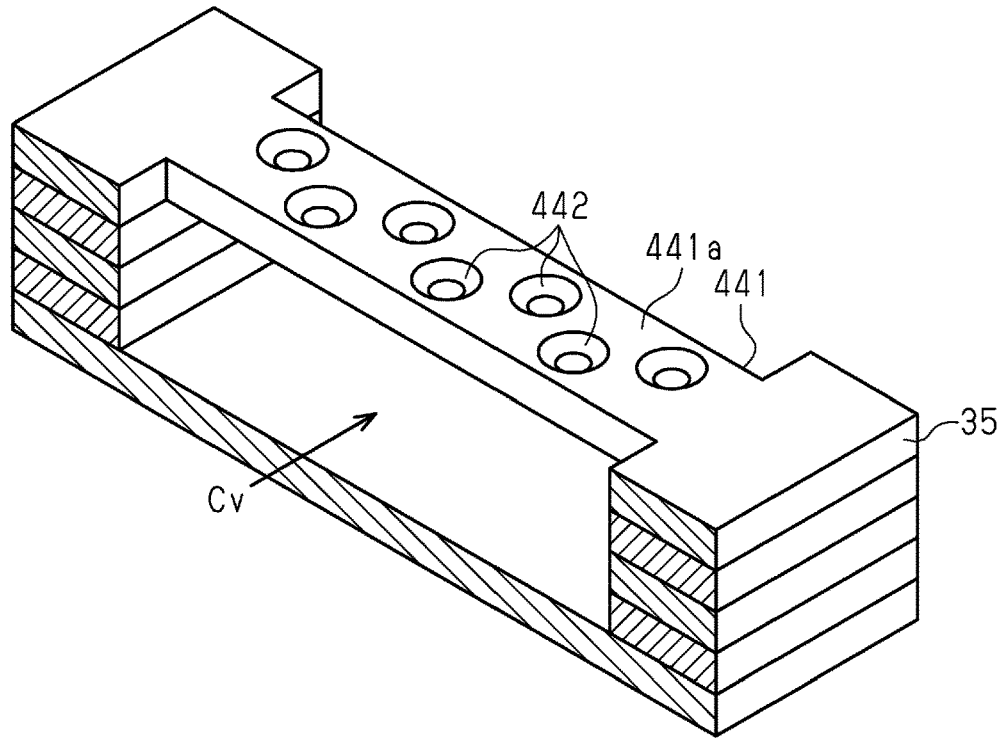

As illustrated in FIG. 30, the intermediate metal layer 35 includes a joint beam 441. The joint beam 441 has an upper surface 441a including recesses 442. Each recess 442 may have any shape and include, for example, a side surface and a bottom surface, a tapered side surface, or a spherical surface. The joint beam 441, which includes the recesses 442, increases the strength of the joint beam 441 and improves the flow of the vapor Cv.

In the joint beam 335 of the intermediate metal layer 35 illustrated in FIG. 21, the surface having a larger area, or the base 335B, may be connected to the lower surface of the outermost metal layer 36 in the same manner as the joint beam 115 illustrated in FIG. 7. This further improves the flowability of the vapor Cv as compared to a case in which the protrusion 335T is connected to the lower surface of the outermost metal layer 36. Also in the joint beams 345, 355, and 365 illustrated in FIGS. 22 to 24, the bases 345B, 355B, and 365B may be connected to the lower surface of the outermost metal layer 36 in the same manner as the joint beam 115 illustrated in FIG. 7. This further improves the flowability of the vapor Cv.

It should be apparent to those skilled in the art that the foregoing embodiments and modified examples may be implemented in many other specific forms without departing from the scope of this disclosure. Particularly, it should be understood that the foregoing embodiments and modified examples may be implemented in the following forms.

In the embodiments and modified examples, the joint beams (for example, the joint beams 52 to 55 illustrated in FIG. 5) of the intermediate metal layers 32 to 35 are laid out along the flow of the vapor Cv. However, the layout order may be changed.

In the embodiments and modified examples, the metal layers 31 to 36 are directly bonded with each other through solid-phase bonding or the like. In this case, as the area of contact between adjacent ones of the intermediate metal layers in the stack direction increases, the bonding strength increases. For example, as in the joint beams 112 and 115 illustrated in FIG. 7, in the joint beam 112 of the intermediate metal layer 32 located adjacent to the outermost metal layer 31, the lower surface has a larger area than the upper surface and is connected to the outermost metal layer 31. In the joint beam 115 of the intermediate metal layer 35 located adjacent to the outermost metal layer 36, the upper surface has a larger area than the lower surface and is connected to the outermost metal layer 36. Thus, the bonding strength is further increased. Also, in the joint beam 212 illustrated in FIG. 17, the lower surface 212b has a larger area than the upper surface 212a and is connected to the outermost metal layer 31. Thus, the bonding strength is further increased. Additionally, the upper surface 215a of the joint beam 215 illustrated in FIG. 17 may be connected to the outermost metal layer 36. As a result, the intermediate metal layer 35 is bonded to the outermost metal layer 36 with greater strength. In this case, when the upper surface of the joint beam 215 has a larger area than the lower surface, the bonding strength will be further increased.

In the embodiments and modified examples, part of the configuration may be appropriately replaced with a known configuration. The embodiments and modified examples may be partially or entirely combined with each other.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A loop heat pipe comprising:
a metal layer stack of two outermost metal layers and intermediate metal layers stacked between the two outermost metal layers, wherein
the metal layer stack includes
an evaporator that vaporizes a working fluid,
a condenser that liquefies the working fluid vaporized by the evaporator,
a vapor pipe connecting the evaporator to the condenser, and
a liquid pipe connecting the condenser to the evaporator,
the vapor pipe includes
two pipe walls defining a flow passage of the vapor pipe, and
joint beams arranged along the flow passage in positions that do not overlap with each other in a plan view, each of the joint beams being continuous with two pipe walls and joining the two pipe walls to each other,
each of the intermediate metal layers includes one of the joint beams, and
said each of the joint beams includes a side surface that is inclined, wherein the side surface of said each of the joint beams is concave-curved.

2. The loop heat pipe according to claim 1, wherein
said each of the joint beams includes a first surface and a second surface located at opposite sides in a thickness-wise direction,
the first surface of said each of the joint beams has a smaller area than the second surface of said each of the joint beams, and
the side surface of said each of the joint beams is inclined in an outer direction from the first surface of said each of the joint beams toward the second surface of said each of the joint beams.

3. The loop heat pipe according to claim 2, wherein the second surface of any one of the joint beams is connected to one of the two outermost metal layers.

4. The loop heat pipe according to claim 1, wherein
said each of the joint beams includes a first surface and a second surface located at opposite sides in a thickness-wise direction,
the side surface of said each of the joint beams includes
a first side surface inclined in an outer direction from the first surface of said each of the joint beams toward the second surface of said each of the joint beams,
a second side surface inclined in the outer direction from the second surface of said each of the joint beams toward the first surface of said each of the joint beams, and
a projection projecting in the outer direction at a boundary portion of the first side surface of the side surface of said each of the joint beams and the second side surface of the side surface of said each of the joint beams.

5. The loop heat pipe according to claim 4, wherein the first side surface of the side surface of said each of the joint beams and the second side surface of the side surface of said each of the joint beams differ in length in the thickness-wise direction.

6. The loop heat pipe according to claim 4, wherein
the first side surface of the side surface of said each of the joint beams is longer than the second side surface of the side surface of said each of the joint beams in the thickness-wise direction, and
the second surface of any one of the joint beams is connected to one of the two outermost metal layers.

7. The loop heat pipe according to claim 1, wherein
said each of the intermediate metal layers includes two walls forming the two pipe walls of the vapor pipe, and
said each of the joint beams is at least partially thinner than each of said two walls of a corresponding one of the intermediate metal layers.

8. The loop heat pipe according to claim 7, wherein
the intermediate metal layers include
a first intermediate metal layer directly connected to one of the two outermost metal layers, and
a second intermediate metal layer directly connected to the other one of the two outermost metal layers,
the joint beams include
a first joint beam arranged in the first intermediate metal layer, and
a second joint beam arranged in the second intermediate metal layer, and
at least one of the first joint beam and the second joint beam is spaced apart from a corresponding one of the two outermost metal layers and forms a flow passage space in which the working fluid flows.

9. The loop heat pipe according to claim 7, wherein said each of the joint beams includes
a base thinner than said each of said two walls of the corresponding one of the intermediate metal layers, and
a protrusion arranged on at least one of an upper side or a lower side of the base of said each of the joint beams.

10. A loop heat pipe comprising:
a metal layer stack of two outermost metal layers and intermediate metal layers stacked between the two outermost metal layers, wherein
the metal layer stack includes
an evaporator that vaporizes a working fluid,
a condenser that liquefies the working fluid vaporized by the evaporator,
a vapor pipe connecting the evaporator to the condenser, and
a liquid pipe connecting the condenser to the evaporator,
the vapor pipe includes
two pipe walls defining a flow passage of the vapor pipe, and
joint beams arranged along the flow passage in positions that do not overlap with each other in a plan view, each of the joint beams being continuous with the two pipe walls and joining the two pipe walls to each other,
each of the intermediate metal layers includes two walls forming the two pipe walls of the vapor pipe and one of the joint beams, wherein the joint beams are arranged to be discontinuous, in said each of the intermediate metal layers, in a direction in which a vapor flows through the flow passage, and
said each of the joint beams is at least partially thinner than each of said two walls of a corresponding one of the intermediate metal layers.

* * * * *